(12) United States Patent
Lincoln et al.

(10) Patent No.: US 7,397,676 B2
(45) Date of Patent: *Jul. 8, 2008

(54) CLASS E AMPLIFIER WITH INDUCTIVE CLAMP

(75) Inventors: Daniel J. Lincoln, Brockport, NY (US); Paul G. Bennett, Bristol (GB)

(73) Assignee: MKS Instruments, Inc., Wilmington, MA (US)

( * ) Notice: Subject to any disclaimer, the term of this patent is extended or adjusted under 35 U.S.C. 154(b) by 4 days.

This patent is subject to a terminal disclaimer.

(21) Appl. No.: 11/619,246

(22) Filed: Jan. 3, 2007

(65) Prior Publication Data

US 2007/0206395 A1 Sep. 6, 2007

Related U.S. Application Data

(63) Continuation of application No. 10/760,174, filed on Jan. 16, 2004, now Pat. No. 7,180,758, which is a continuation-in-part of application No. 10/657,825, filed on Sep. 8, 2003, now Pat. No. 6,885,567, which is a continuation of application No. 10/227,613, filed on Aug. 23, 2002, now Pat. No. 6,618,276, which is a continuation of application No. 09/763,500, filed as application No. PCT/US00/19835 on Jul. 21, 2000, now Pat. No. 6,469,919.

(30) Foreign Application Priority Data

| Jul. 22, 1999 | (GB) | .................................. | 9917047.4 |
| Apr. 20, 2000 | (GB) | .................................. | 0009669.3 |

(51) Int. Cl.
*H02H 7/122* (2006.01)

(52) U.S. Cl. .................. 363/56.01; 363/56.06

(58) Field of Classification Search .................. 363/17, 363/55, 56.01, 56.02, 56.03, 56.04, 56.05, 363/56.06, 95, 97, 131, 132
See application file for complete search history.

(56) References Cited

U.S. PATENT DOCUMENTS

| 3,493,878 A | 2/1970 | Fautale |
| 3,636,380 A | 1/1972 | Anderson |

(Continued)

FOREIGN PATENT DOCUMENTS

| AT | 342713 | 4/1978 |

(Continued)

*Primary Examiner*—Adolf Berhane
(74) *Attorney, Agent, or Firm*—Harness, Dickey & Pierce P.L.C.

(57) ABSTRACT

A power supply including an inverter receiving a DC input signal from a DC input source (11). The inverter is implemented as a single-ended inverter. Each inverter is driven by a signal source (13A, 13B), which outputs an AC signal. The output from each inverter is input to a first stage harmonic filter. The power supply includes an output circuit that includes a rectifier (D1) arranged about a point so that if the inverter attempts to drive the point beyond a predetermined voltage, the rectifier conducts in order to return at least one of power and current to the DC input source. The output from the first harmonic filter (L1A, C1; L1B, C1) is output to a second harmonic filter (L2, C2) and is then output from the power supply.

20 Claims, 24 Drawing Sheets

U.S. PATENT DOCUMENTS

| | | | |
|---|---|---|---|
| 3,899,745 A | 8/1975 | Fletcher et al. | |
| 3,939,380 A | 2/1976 | Peer | |
| 4,021,748 A | 5/1977 | Yoshida et al. | |
| 4,042,890 A | 8/1977 | Eckerle | |
| 4,047,120 A | 9/1977 | Lord et al. | |
| 4,067,057 A | 1/1978 | Taddeo et al. | |
| 4,173,739 A | 11/1979 | Yoshida et al. | |
| 4,182,992 A | 1/1980 | Attwood et al. | |
| 4,268,898 A | 5/1981 | Brown | |
| 4,408,267 A | 10/1983 | Pruitt | |
| 4,429,339 A | 1/1984 | Jaeschke et al. | |
| 4,455,600 A | 6/1984 | Bobry | |
| 4,509,101 A | 4/1985 | Kenji et al. | |
| 4,511,823 A | 4/1985 | Eaton et al. | |
| 4,550,359 A | 10/1985 | West | |
| 4,560,851 A | 12/1985 | Tsukamoto et al. | |
| 4,564,879 A | 1/1986 | Bienstman et al. | |
| 4,600,891 A | 7/1986 | Taylor, Jr. et al. | |
| 4,639,849 A | 1/1987 | Noworolski et al. | |
| 4,670,832 A | 6/1987 | Park | |
| 4,691,270 A | 9/1987 | Pruitt | |
| 4,709,323 A | 11/1987 | Lien | |
| 4,719,556 A | 1/1988 | Wise | |
| 4,720,775 A | 1/1988 | Cathell | |
| 4,725,762 A | 2/1988 | Jagschitz et al. | |
| 4,739,463 A | 4/1988 | Barna et al. | |
| 4,745,537 A | 5/1988 | Cheung et al. | |
| 4,910,416 A | 3/1990 | Salcone | |
| 4,914,399 A | 4/1990 | Doany | |
| 4,916,599 A | 4/1990 | Traxler et al. | |
| 4,992,749 A | 2/1991 | Tokumo et al. | |
| 5,019,770 A | 5/1991 | Harada et al. | |
| 5,023,566 A | 6/1991 | El-Hamamsy et al. | |
| 5,045,989 A | 9/1991 | Higaki et al. | |
| 5,077,651 A | 12/1991 | Kobayashi et al. | |
| 5,117,167 A | 5/1992 | Kazmirski | |
| 5,117,198 A | 5/1992 | Morenz | |
| 5,187,580 A | 2/1993 | Porter, Jr. et al. | |
| 5,196,995 A | 3/1993 | Gulczynski | |
| 5,218,315 A | 6/1993 | Turner | |
| 5,303,139 A | 4/1994 | Mark | |
| 5,314,603 A | 5/1994 | Sugiyama et al. | |
| 5,367,228 A | 11/1994 | Kachmarik et al. | |
| 5,471,376 A | 11/1995 | Tsai et al. | |
| 5,610,553 A | 3/1997 | Kirn | |
| 5,638,266 A | 6/1997 | Horie et al. | |
| 5,717,293 A | 2/1998 | Sellers | |
| 5,747,935 A | 5/1998 | Porter et al. | |
| 5,747,942 A | 5/1998 | Ranganath | |
| 5,757,942 A | 5/1998 | Kamatani et al. | |
| 5,838,193 A | 11/1998 | Myers et al. | |
| 5,909,086 A | 6/1999 | Kim et al. | |
| 5,910,886 A | 6/1999 | Coleman | |
| 5,917,382 A | 6/1999 | Chiozzi et al. | |
| 5,952,794 A | 9/1999 | Bergman et al. | |
| 5,963,086 A | 10/1999 | Hall | |
| 5,973,437 A | 10/1999 | Gradzki et al. | |
| 5,982,231 A | 11/1999 | Nalbant | |
| 5,991,167 A | 11/1999 | Van Lerberghe et al. | |
| 5,994,848 A | 11/1999 | Janczak | |
| 6,016,075 A | 1/2000 | Hamo | |
| 6,016,258 A | 1/2000 | Jain et al. | |
| 6,043,607 A | 3/2000 | Roderick | |
| 6,046,546 A | 4/2000 | Porter et al. | |
| 6,072,362 A | 6/2000 | Lincoln | |
| 6,088,051 A | 7/2000 | Barraud et al. | |
| 6,088,052 A | 7/2000 | Guralnick et al. | |
| 6,091,288 A | 7/2000 | Moisin | |
| 6,469,919 B1 * | 10/2002 | Bennett | 363/56.02 |
| 6,618,276 B2 * | 9/2003 | Bennett | 363/56.02 |
| 6,885,567 B2 * | 4/2005 | Lincoln et al. | 363/56.01 |
| 7,180,758 B2 * | 2/2007 | Lincoln et al. | 363/56.01 |

FOREIGN PATENT DOCUMENTS

| | | |
|---|---|---|
| AT | 375499 | 8/1984 |
| AT | 380373 | 5/1986 |
| AT | 383000 | 5/1987 |
| AT | 384339 | 10/1987 |
| AT | 386103 | 7/1988 |
| AT | 392384 | 8/1991 |
| DE | 19522369 A1 | 1/1997 |
| EP | 0358191 | 3/1990 |
| EP | 0419230 | 3/1991 |
| EP | 0481304 | 4/1992 |
| GB | 2131236 | 6/1984 |
| GB | 2175154 | 11/1986 |
| GB | 2197550 | 5/1988 |
| GB | 2199184 | 6/1988 |
| GB | 2225497 | 5/1990 |
| GB | 2249226 | 4/1992 |
| GB | 2293505 | 3/1996 |
| SU | 669341 | 6/1979 |
| SU | 928326 | 5/1982 |
| WO | WO-8501844 | 4/1985 |

* cited by examiner

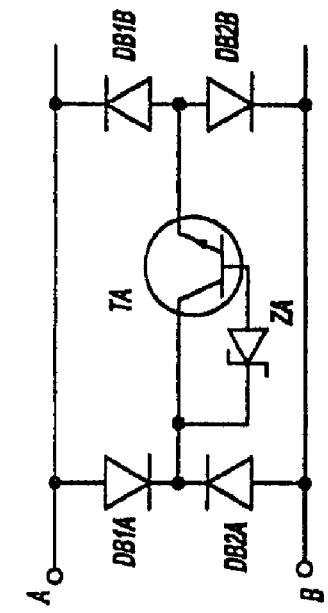
*Figure - 24*
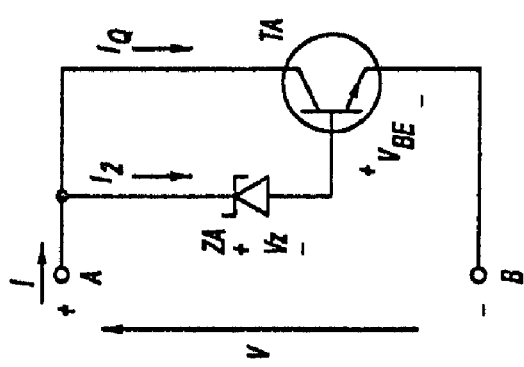
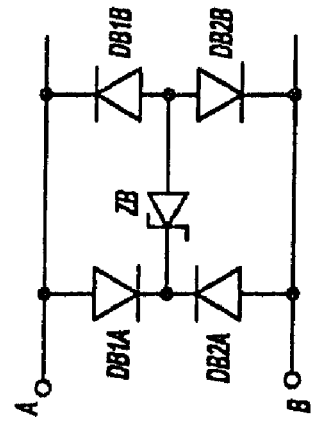
*Figure - 25*
*Figure - 26*

(a) 50 ohms INDUCTIVE (b) 12 ohms INDUCTIVE (c) 12 ohms CAPACITIVE (d) 25 ohms INDUCTIVE (e) SHORT CIRCUIT (f) 25 ohms CAPACITIVE

CLASS E AMPLIFIER WITH INDUCTIVE CLAMP

CROSS-REFERENCE TO RELATED APPLICATIONS

This application is a continuation of U.S. patent application Ser. No. 10/760,174, filed Jan. 16, 2004 now U.S. Pat. No. 7,180,758, which is a continuation-in-part of U.S. patent application Ser. No. 10/657,825, filed Sep. 8, 2003 now U.S. Pat. No. 6,885,567, which is a continuation of U.S. patent application Ser. No.10/227,613, filed Aug. 23, 2002 now U.S. Pat. No. 6,618,276, which is a continuation of U.S. patent application Ser. No. 09/763,500 filed Mar. 26, 2001 now U.S. Pat. No. 6,469,919, which is a U.S. National filing of PCT/US00/19835 filed Jul. 21, 2000, which claims priority to GB 9917047.4 filed Jul. 22, 1999 and GB0009669.3 filed Apr. 20, 2000. The disclosures of the above applications are incorporated herein by reference.

FIELD OF THE INVENTION

This invention relates generally to power supplies for supplying alternating power and, more particularly, to a protection circuit for the switching portion of a power supply where the switching portion of the power supply is implemented as a class E amplifier.

BACKGROUND OF THE INVENTION

Radio frequency (RF) energy is used in various industries for the treatment of materials through induction heating, dielectric heating, and plasma excitation. Plasma excitation can take the form of inductive, capacitive, or true electromagnetic (EM) wave, microwave, couplings. Generators which provide this RF energy utilize many circuit topologies ranging from single class A transistor amplifiers providing a few tens of watts to self-oscillating tube (valve) generators providing many thousands of watts.

The semiconductor manufacturing industry utilizes RF plasmas for depositing and etching micron and sub-micron sized films. A typical power supply for this application may consist of a line frequency transformer/rectifier/capacitor DC power supply and high frequency (HF) linear power amplifier. Typical power and frequency values may be up to 10 KW within the range of 400 KHz to 60.0 MHz. The linear power amplifier employs high frequency/very high frequency (HF/VHF) RF power transistors having high power dissipation capability. Such a power supply or generator would have power controllable to 1 or 2% precision over a 100:1 output load range. Usually the generator is specifically configured to output to a defined load, usually 50 ohms, but should be able to drive any load, even if mismatched, without failure. Typical protection schemes reduce the power. For example, the drive level to a linear amplifier is reduced to correspondingly reduce current or power dissipation. In a 50 ohm system, variation from the typical 50 ohms can be measured as reflected power. The drive level is reduced to limit reflected power.

FIG. 1 shows a typical transformer-coupled push-pull RF power amplifier having switches or transistors S1, S2 driven by sine waves which are out of phase. A five element harmonic rejection filter includes inductors L1, L2 and capacitors C1, C2, and C4. The harmonic rejection filter typically ensures a high purity or uniform sine wave output. No biasing schemes are shown which may be class AB or class B. Either bipolar junction transistors (BJTs) or metal oxide semiconductor field effect transistors (MOSFETs) are typically used.

The transformer T1 has a ratio chosen to match the required power for a given DC supply voltage, usually 28V or 50V. Detailed circuitry follows standard industry practice for broadband HF/VHF power amplifier design as would be used for communications.

The amplifier of FIG. 1 offers one primary advantage, but several disadvantages. The primary advantage is that in a broadband design, the output frequency is easily changed simply by varying the drive or input frequency. For a given output frequency, only the output filter needs to be changed. If the basic linearity/purity of the amplifier is good enough, dispensed with altogether. The circuit of FIG. 1 has the disadvantages of poor efficiency and high transistor power dissipation. Efficiency theoretically cannot exceed 70% but typically is no better than 50%. To address the high power dissipation, many applications use expensive, special RF transistors which often employ beryllium oxide (BEo) low thermal resistance technology. This often requires large air or water cooled heatsinks. There is a large amount of data published on RF linear amplifier design. Any power supply manufacturer desiring to design a generator can use the transistor manufacturer's application circuit with a high degree of confidence.

As can be seen in FIG. 2, the circuit of FIG. 2 utilizes a different mode of operation offering high efficiency and low power dissipation. The drive signals in the circuit of FIG. 2 are fixed at square waves so that the transistors are now in a switching rather than a linear mode of operation. That is, the switches or transistors S1, S2 of FIG. 1 operate in a region between fully off and fully on. The switches or transistors S1, S2 of FIG. 2 operate by switching from fully on to fully off. The output of transformer T1 is now a square wave. A four element filter including inductors L1, L2 and capacitors C1, C2 filters out the required fundamental frequencies to yield a sinusoidal output. Capacitor C4 is removed so that the filter provides an inductive input, in order to reject harmonic current. Although the transistor and transformer voltages are square, the currents are sinusoidal. Efficiency can now be 100%, and typically falls within the range of 80-95%. Such a circuit is usually referred to as a resonant converter or inverter rather than an amplifier.

The circuit of FIG. 2 suffers some disadvantages. The filter is sufficiently selected for a particular output frequency so that only a fixed or narrow frequency range or band of operation is possible. Also, the output power cannot be directly controlled. Unlike, FIG. 1, the circuit of FIG. 2 cannot connect directly to a line or outlet voltage. Rather, the DC input to FIG. 2 requires regulation using an additional power converter, typically implemented using a switched mode converter. Further, mismatch loads can cause high circulating currents between the filter and transistors. The circulating currents are not necessarily limited by limiting the DC input current.

With particular respect to class E amplifiers, a class E amplifier is a switch-mode amplifier topology offering high efficiency. Because of its topology, the switch element, typically a transistor, of the class E amplifier spends little or no time in the active region where the greatest power dissipation occurs. In this configuration, the switch element of the class E amplifier operates more like a switch rather than a transistor. That is, the switching element spends the majority of its time in either the cutoff or the saturation regions.

Designers further improve the efficiency of the class E amplifier by using a switch-mode technique known as the zero-voltage switching (ZVS). ZVS prevents the switch element of the class E amplifier from passing through the active region during transitions. By applying an inductive load at the output of the switch element, the parasitic and swamping capacitances at the output of the switch element are discharged to zero volts before the switch element attempts to transition from the cutoff region to the saturation region. An inductor and a capacitor cooperate to form a series-resonant circuit and provide an inductive load at an output of the switch element. The frequency of the resonant circuit is less than the operating frequency of the amplifier. When this occurs, the inductor of the resonant circuit dominates the resonant circuit and generates an inductive load on the transistor.

In order to perform ZVS, the switch element must be designed to permit negative drain-source current to pass through it, even if the device channel is in the cutoff region. Such a requirement suggests that a MOSFET is a preferred selection for the switch element of the class E amplifier topology because MOSFETs have an intrinsic body diode at the substrate connection to the source. Other transistors may be selected, such as a bipolar junction transistor (BJT) or an integrated gate bipolar transistor (IGBT), but such a configuration requires that a fast diode be placed across the emitter-collector junction.

The primary benefit of the class E amplifier is that more RF power can be realized from the same transistor used in a class E topology versus other topologies, primarily due to reduced device dissipation. On the other hand, the class E amplifier generates substantial second harmonic energy that must be removed from the RF output. Such topologies typically require at least one additional stage of filtering before the RF power is delivered to the load.

As discussed previously, the series-resonant circuit consisting of an inductor and a capacitor possess a resonant frequency below the amplifier operating frequency. Although the load could be any combination of capacitors, inductors, and resistors, if the load is only a capacitor with a value such that the series combination of the resonant circuit and the load has a resonant frequency equal to the amplifier operating frequency, the current through the switch element could approach an infinite value. This could result in damage to the transistor. Typical class E amplifier applications, however, avoid transistor damage by utilizing an external control loop that clamps the amplifier output reflected power. Once the control loop senses that the reflected power has exceeded a preset limit, the control loop reduces the voltage at the DC rail until the reflected power matches a predetermined limit. The control loop must react quickly in order to avoid impact to the transistor. Impact to the transistor can also be avoided by reducing the RF amplifier input power to zero. However, in a plasma processing application, such an action may cause the undesirable result that the plasma is extinguished.

SUMMARY OF THE INVENTION

In one aspect of the present invention, a power supply circuit having a DC input supplies alternating power to a load. An inverter generates an alternating output, and an output circuit directly receives the alternating output and feeds it to a load. The output circuit includes first and second rectifiers connected relative to a point in the output circuit so that if the inverter attempts to drive the point to a voltage which exceeds either a predetermined positive voltage or a predetermined negative voltage, a respective one of the first and second rectifiers conducts to cause voltage and/or current to return to the source of DC voltage. The voltage and/or current is fed back into the inverter. This may be achieved, for example, by the first rectifier being connected between the ground or negative input of the DC input and the point and the second rectifier being connected between the point and the positive input of the DC voltage. It will be appreciated that when either rectifier conducts it clamps the point to the voltage of its associated respective input of the DC input. The rectifiers may be embodied as diodes.

In an alternative arrangement, the rectifiers may be connected to a separate voltage source or sources, and the clamping will occur to the voltages determined by the sources. The present invention includes a constant voltage sink if, for example, the first and second rectifiers are implemented using Zener diodes. The Zener diodes may dissipate at least some of the voltage and/or current, and they may have an associated transistor through which a higher level of energy can be dissipated. In either case the dissipation occurs through heating. The Zener diodes may be connected back to back so that each diode performs the rectifying action for the other diode. Alternatively, a suitable, separate rectified diode, or rectifying circuit, is used in series with each Zener. In the construction in which the first and second diodes are connected on either side of the point, each diode may be implemented by forming a chain of diodes, such as Shottky diodes, and the diodes may be configured in a single ceramic substrate.

The inverter may include at least two switching devices. The power supply circuit may also include an inductance connected to a point between the two switching devices so that the charging and discharging of the devices, and any associated capacitance, is substantially by means of the inductive current.

In yet another aspect of the present invention, a power supply circuit has a DC input and supplies alternating power to a load. An inverter generates an alternating output, and an output circuit directly receives the alternating output and feeds it to a load. The output circuit further includes a constant voltage sink for dissipating voltage and/or current if the inverter seeks to drive a predetermined point in the circuit to a voltage which lies outside a predetermined voltage band.

In yet another aspect of the present invention, a power supply includes a supply output and first and second power supply circuits as defined above. The output of each first and second power circuit is connected in parallel to the supply output. Respective alternating signal sources switch the inverters of the first and second supply circuits and control a circuit for altering the relative phase of the signal sources to adjust the power at the supply output. The power supply circuits may be connected in series or parallel.

In yet another aspect of the present invention, a power supply supplies alternating current to a load. First and second power supply circuits each include inverters. An alternating signal source supplies an alternating signal to switch the inverter and to respective power outputs. The power outputs are connected in parallel or series to the supply output through harmonic filters. A control circuit varies the relative phase of the alternating signals to adjust the power at the supply output.

In yet another aspect of the present invention, an input circuit for a voltage inverter has at least two switching devices. The circuit includes an inductance connected to a point between the devices so that charging and discharging the devices, and any associated capacitance, is substantially through an inductive current.

In yet another aspect of the present invention, a power supply circuit for supplying alternating power to a load. The power supply circuit includes a source of direct current (DC) voltage and a class E amplifier. The class E amplifier receives the DC input voltage and generates an alternating current (AC) output signal. The power supply circuit also includes a first harmonic filter at the output of the amplifier. The first harmonic filter filters out predetermined harmonic components of the AC signal to generate a filtered AC signal. An output circuit at the output of the first harmonic filter receives the filtered AC signal and feeds the filtered AC signal to a load. The output circuit includes a rectifier connected relative to a point in the output circuit such that if the voltage at the point exceeds a predetermined threshold, the rectifier conducts to cause at least one of voltage and current to return to the source of DC voltage and clamps the point to a predetermined voltage.

For a more complete understanding of the invention, its objects and advantages, reference should be made to the following specification and to the accompanying drawings.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

The invention may be performed in a number of ways and specific related inventions will now be described, by way of example, with reference to the accompanying drawings, in which;

FIGS. 23-26 illustrate alternative constant voltage sink arrangements for use with the inverter of FIG. 22.

DETAILED DESCRIPTION OF THE PREFERRED EMBODIMENTS

The following description of the preferred embodiment(s) is merely exemplary in nature and is in no way intended to limit the invention, its application, or uses.

Figure 3:
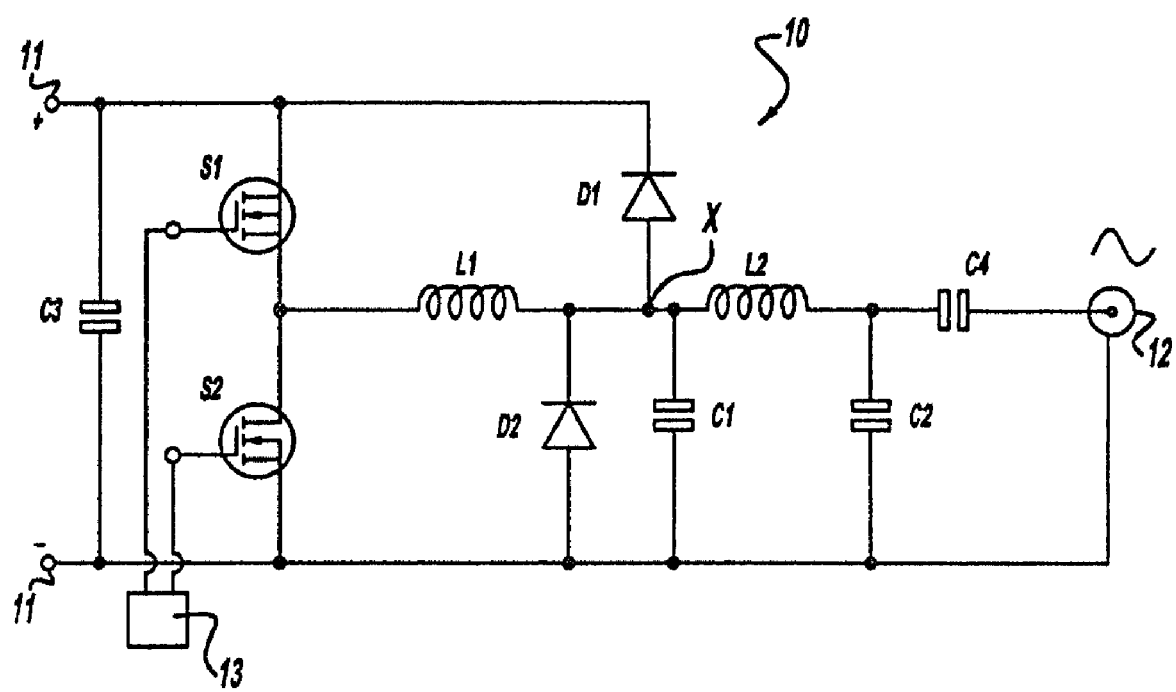
FIG. 3 is a power supply circuit arranged in accordance with the principles of the present invention.

With reference to FIG. 3, a voltage inverter circuit is generally indicated at 10 and has a direct current (DC) voltage source input at 11 and an alternating current (AC) output at 12. It should be noted from the outset that in describing the figures, switches will generally be referred to using S followed by a number; capacitors will be referred to using C followed by a number; inductors will be referred to using L followed by a number; diodes will be referred to using D followed by a number; and transformers will be referred to using T followed by a number. Further, in circuits which have a generally symmetric topology, each of the above reference symbols may be followed by a letter suffix to indicate generally similar, symmetric elements.

Switches S1, S2 receive as input respective out of phase square wave signals from a signal source or generator 13. The square wave signals turn on switches S1, S2 in a manner to reverse the polarity of the voltage across inductor whenever either L1 switch S1 or S2 is turned on. When signal source 13 drives switches S1, S2 in such a manner, switches S1, S2 and capacitor C3 cooperate to invert the DC input signal to an AC signal which is applied to inductor L1. This creates the alternating output at 12, with DC components being blocked by capacitor C4. The frequency of the output signal at 12 depends upon the frequency of the signals output by signal source 13. A four element harmonic filter comprising inductors L1, L2 and capacitors C1, C2 operate generally as described above. Inductor L1 and capacitor C1 form a first stage of the harmonic filter and inductor L2 and capacitor C2 form a second stage of the harmonic filter. The output filter removes harmonic components of the signal input to inductor L1 to improve the purity of the output sign wave and matches the required output power for a given input voltage to the output impedance, which is typically 50 ohms.

Figure 1:
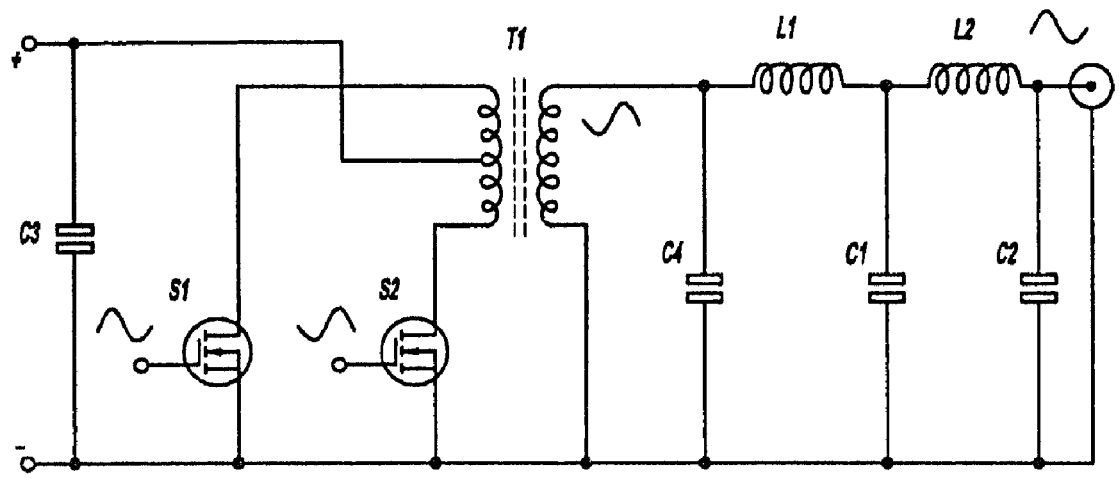
FIGS. 1 and 2 are circuit topologies practiced in the prior art, as described above.
Figure 2:
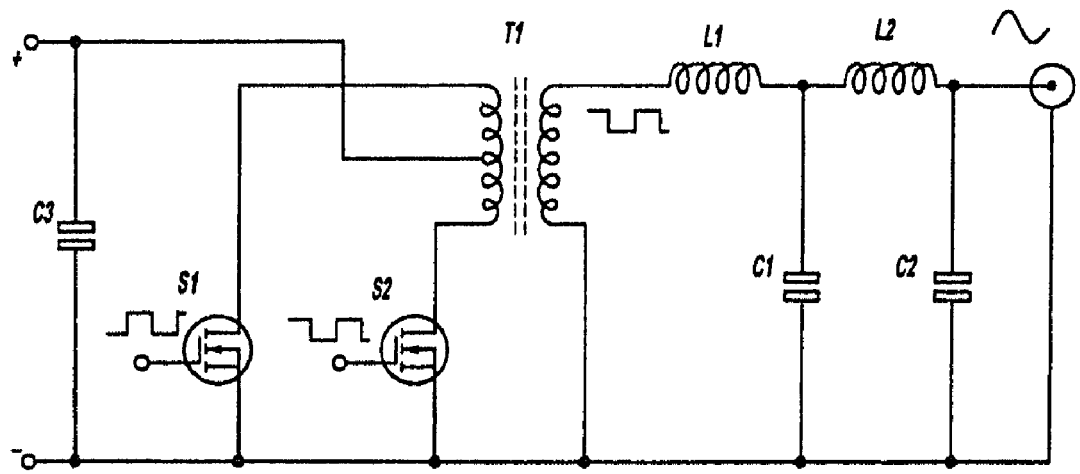

As discussed above, the circuit of FIGS. 1 and 2 could be highly vulnerable to high circulating currents created by mismatch loads. A pair of clamping diodes or rectifiers D1 and D2 inserted between the first and second stage harmonic filters alleviates potential damage due to circulating currents. Diode D2 extends from the negative rail of DC input source 11 up to a node X. Diode D1 extends from node X to the positive rail of DC input source 11. In operation, if the circuit attempts to drive the node X beyond the rail voltage, in one direction or the other, then the diode associated with that rail will turn on and become conductive. When the diode turns on, the diode clamps node X to the rail voltage and feeds back the excess voltage and/or current into the inverter, particularly input source 11 and capacitor C3. More particularly, if the circuit attempts to drive node X above the voltage at the positive rail of the DC input 11, diode D1 turns on providing a current path including the body diode of switch S2 back to the DC input voltage source 11 and capacitor C3. Similarly, if the circuit attempts to drive node X below the negative rail of DC source 11, diode D2 becomes conductive, providing a current path back including the body diode of switch S1 to DC input source 11 and capacitor C3. As the effects of mismatch loads increase with frequency, the circuit of FIG. 3 enables an inverter to be used at frequencies which were previously difficult to achieve.

Figure 4:
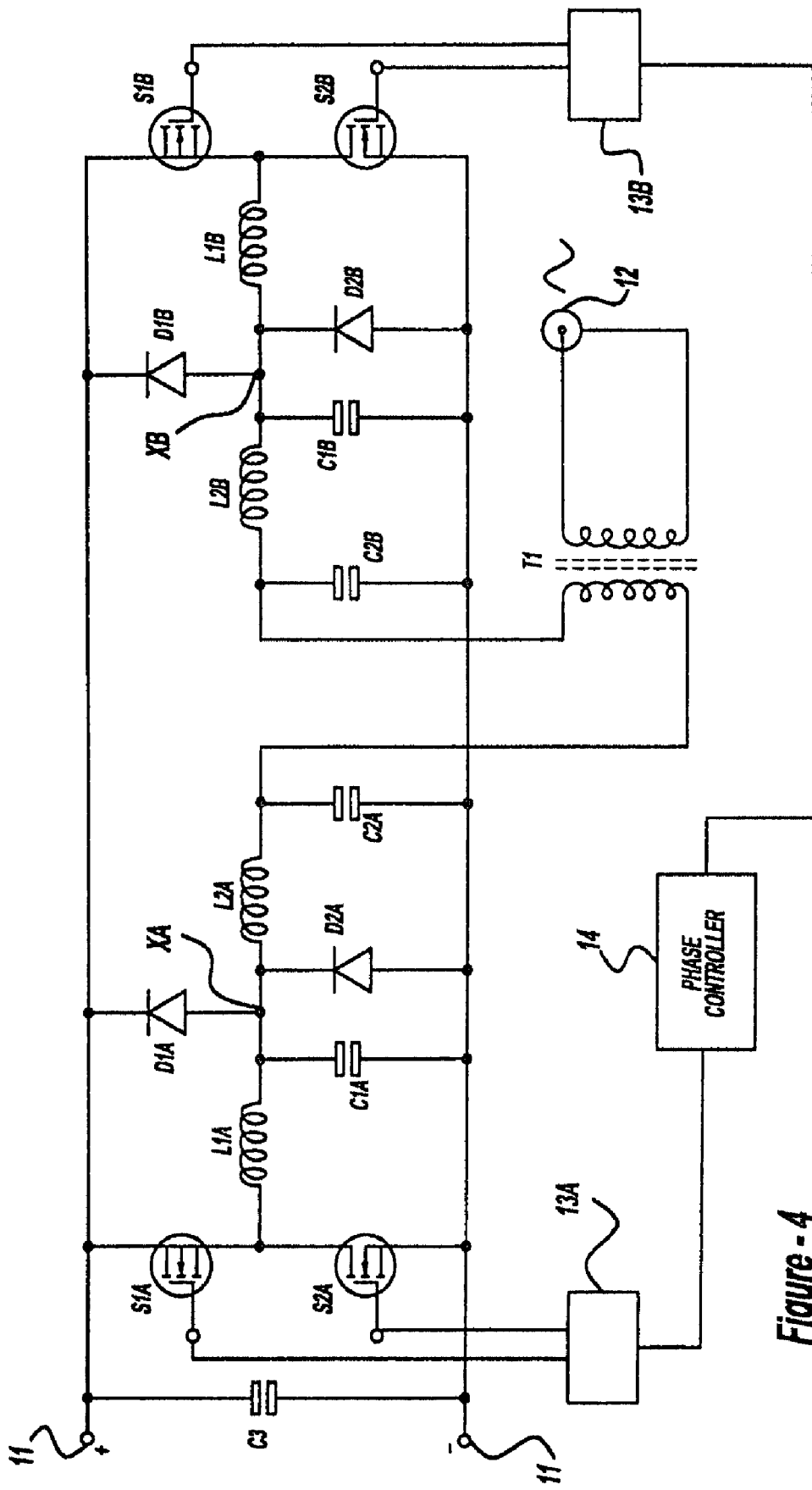
FIG. 4 illustrates a related invention in which circuits are connected in series to produce a combined output.

FIG. 4 illustrates a related invention in which the output of two power supply circuits are placed in series. FIG. 4 includes two halves A and B arranged in a full-bridge configuration. The circuit of FIG. 4 enables adjustment of power at output 12 by varying the phase between the switching signals applied to each of the two halves A and B.

A first half of FIG. 4 includes a pair of switches S1A, S2A which receive a pair of AC signals output by signal source 13A. Switches S1A, S2A are connected in series between the negative and positive voltage rails of a DC power source 11. The output from switches S1A, S2A is applied to inductor L1A, which forms a two stage, four element harmonic filter in combination with inductor L2A and capacitors C1A, C2A. A first clamping diode D1A has a negative terminal or cathode connected to the positive rail of DC input source 11 and a positive terminal or anode connected between inductors L1A, L2A. A second clamping diode D2 has a positive terminal or anode connected to the negative terminal of DC source 11 and a negative terminal or cathode connected to the positive terminal of clamping diode D1A. The output from the harmonic filter is connected to a first end tap of transformer T1.

Clamping diodes D1A, D2A provide protection to the left half of the circuit of FIG. 4. When the circuit attempts to drive the voltage at node XA above the positive rail of DC source 11, diode D1A becomes conductive, thereby clamping the voltage at node XA to approximately the positive rail voltage of DC input source 11, and providing a path back to DC input source 11 and capacitor C3. Similarly, when the circuit attempts to drive node XA below the negative rail voltage of DC input source 11, diode D2A turns on, clamping the voltage at node XA to approximately the negative rail voltage of DC input source 11 and provides a circuit path back to DC input source 11 and capacitor C3, thereby protecting the left half of the circuit of FIG. 4.

The circuit of FIG. 4 also includes a second half, half B, which includes switches S1B, S2B. A signal source 13B outputs a pair of AC signals to switches S1B, S2B. It should be noted that signal sources 13A, 13B may be combined into a single unit. Half B also includes a four element, two stage harmonic filter comprising inductors L1B, L2B and capacitors C1B, C2B. Half B also includes a pair of clamping diodes D1B, D2B arranged in half B as described in half A. The output from circuit half B is connected to an end tap of transformer T1. Circuit half B operates as described with respect to circuit half A. Transformer T1 provides isolation between circuit halves A and B and the output 12. Circuit halves A and B are connected in series through the input coil of transformer T1.

Circuit halves A, B are combined in series such that altering the phase between the switching signals controlling each half varies the power at output 12. In particular, when switch S1A and switch S1B are actuated and deactuated at the same times, switches S1A, S1B are said to operate in phase or at 0 degrees phase. Conversely, if switch S1A is off whenever switch S1B is on and switch S1A is on whenever switch S1B is off, the switches are said to be out of phase or at 180 degrees phase. Similar terminology applies to each of switches S2A, S2B. The phase between each circuit half A, B is determined by a phase controller 14 which provides an output signal to each of signal sources 13A, 13B in order to vary the relative phases between each circuit half. Maximum power at output 12 results when circuit halves A and B are operated at 180 degrees phase or out of phase. Minimum power at output 12 results when circuit halves A and B are operated at 0 degrees phase or in phase. When the phase is zero, each half sees an open circuit regardless of the load impedance. Transformer T1 combines the outputs effectively in series, and no blocking capacitors are required before output 12. The circuit components forming the harmonic filter in each circuit half A and B must be matched or equal to ensure zero output at 0 degrees phase. For example, the values for L1A, L2A, C1A, and C2A should be equal the values for L1B, L2B, C1B, and C2B.

Figure 5:
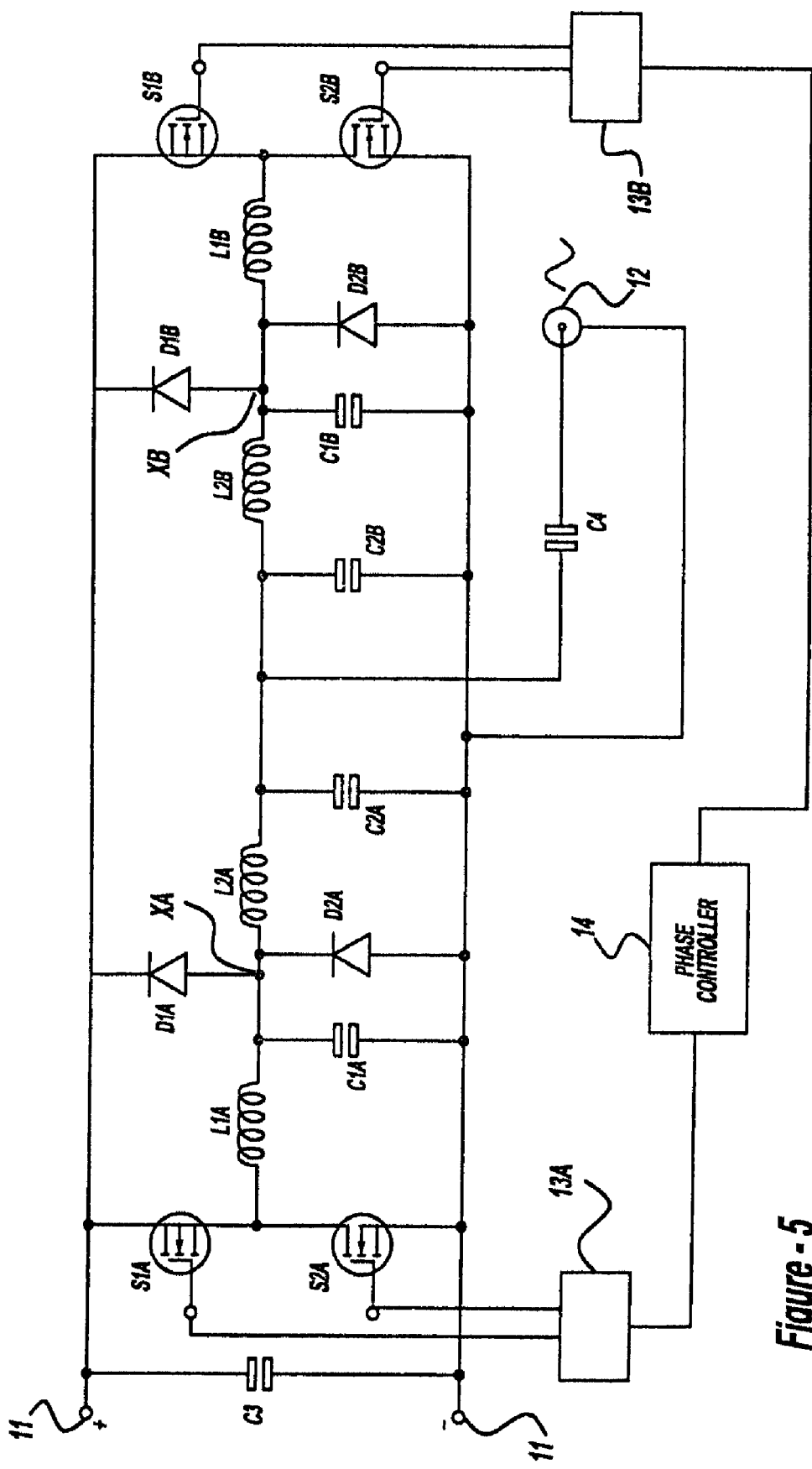
FIG. 5 is a related invention in which circuits are connected in parallel to produce a combined power output.

FIG. 5 depicts a related invention in which a first circuit half A and a second circuit half B are combined in parallel. Circuit half A includes a pair of switches S1A, S2A which receive respective AC input signals from signal generator 13A, which may be combined with signal source 13B to form a single unit. Switches S1A, S2A are connected in series between the respective positive and negative rails of DC input source 11. The output from switches S1A, S2A is applied to a four element, two stage harmonic filter comprising inductors L1A, L2A and capacitors C1A, C2A.

A pair of clamping diodes D1A, D2 are arranged in series between the respective positive and negative rails of DC input source 11. The negative terminal or cathode of diode D1A connects to the positive rail of DC source, and the positive terminal or anode of diode D1A connects to node XA. The negative terminal or cathode of diode D2 connects to node XA, and the positive terminal or anode of diode D2 connects to the negative rail of DC power source 11. The output from circuit half A is determined in accordance with the voltage between the negative rail of DC input source 11 and the output from the four element filter. The output from the filter is applied to a blocking capacitor C4, which blocks any DC component of the output signal. Capacitor C4 also connects to the output 12. In operation, clamping diodes D1A, D2 protect the circuit elements of circuit half A by providing a circuit path to DC input source 11 and capacitor C3 when the circuit attempts to drive node XA beyond a predetermined threshold defined by each of the respective negative and positive rails of DC source 11.

Circuit half B is similarly arranged to and operates in the same manner as circuit half A. In a parallel connection of circuit halves A, B, as shown in FIG. 5, varying the phase of operation between each respective half A, B varies the power at output 12. In particular, when switch halves A, B are operated at 0 degrees or in phase, maximum power is generated at output 12. Conversely, when the switch halves A, B are operated at 180 degrees or out of phase, a short circuit appears, and a minimum power appears at output 12. A phase controller 14 provides a control signal to each of signal generators 13A, 13B in order to control the relative phases between each circuit half A, B. With the phase at 180 degrees each circuit half now sees a short circuit regardless of load impedance. Note that because capacitors C2A and C2B are in parallel, they can be combined into a single component. The circuit components forming the harmonic filter in each circuit half A and B must be matched or equal to ensure zero output at 180 degrees phase. For example, the valves for L1A, L2A, C1A, and C2A should be equal the values for L1B, L2B, C1B, and C2B.

Figure 6:
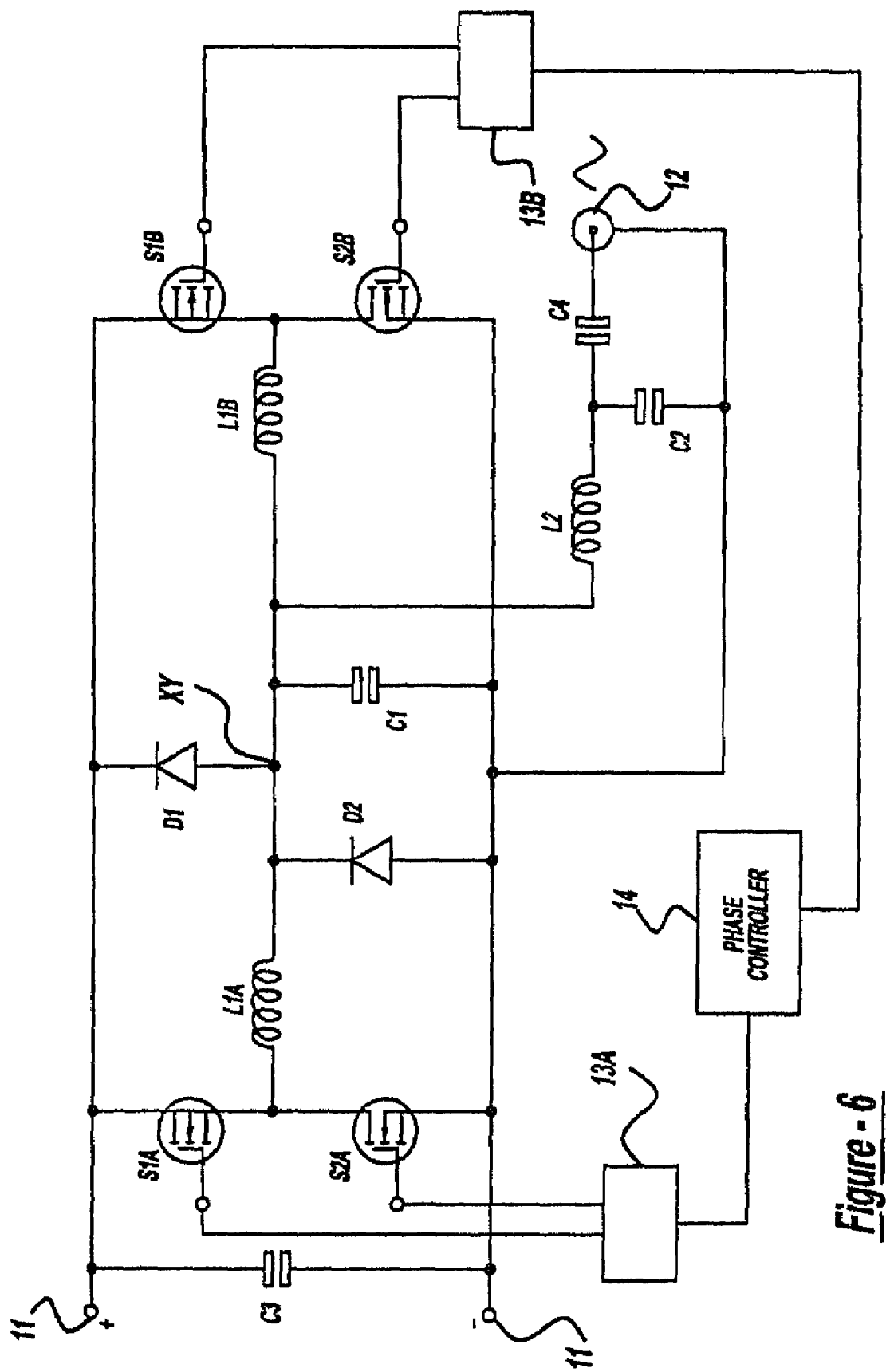
FIG. 6 is a related invention in which each half of a switching bridge is protected by a single clamping diode pair.

FIG. 6 depicts a circuit having circuit halves A, B which cooperate to apply signals to common elements prior to output 12. Circuit half A includes a pair of switches S1A, S2A arranged in parallel between the respective positive and negative voltage rails of DC input source 11. The output from switches S1A, S2A are input to an inductor L1A. A signal source or generator 13A outputs AC signals which control actuation of switches S1A, S2A. Circuit half B includes a pair of switches S1B, S2B arranged in series between the respective positive and negative voltage rails of DC input source 11. The output from switches S1B, S2B are input to inductor L1B. A signal source or generator 13B, which may be combined with signal source 13A into a single unit, provides AC signals to control actuation and deactuation of each respective switch S1B, S2B.

A pair of clamping diodes D1, D2 are arranged in parallel with the respective switch pairs S1A, S2A and S1B, S2B. Clamping diodes D1, D2 provide a circuit path back to DC input source 11 and capacitor C3 when either circuit half A, B attempts to drive node XY beyond a predetermined voltage defined by the respective positive and negative rails of DC input source 11.

Capacitor C1 is arranged between the negative voltage rail of DC source 11 and node XY. The voltage between the negative rail of DC source 11 and node XY defines an input voltage to a filter defined by inductor L2 and capacitor C2, which forms a second stage of the harmonic filter formed by inductors L1A, L2B, L2 and capacitors C1, C2. Capacitor C1 cooperates with each of respective inductors L1A, L2B to provide a first stage of harmonic filter. A blocking capacitor C4 removes DC components of the signal prior to output at output 12.

Clamping diodes D1, D2 provide a circuit path back to DC input source 11 and capacitor C3 when either circuit half A, B attempts to drive node XY above the positive voltage rail of DC source 11 or below the negative voltage rail of DC source 11. Thus, regardless of what circuit half A, B drives node XY beyond the above-described predetermined thresholds, clamping diodes D1, D2 operate to protect the circuit of FIG. 6 by providing a circuit path back to DC source 11 and capacitor C3.

The circuit of FIG. 6 also includes a phase controller 14 for controlling the relative phases between circuit halves A, B by generating control signals to each of respective signal sources 13A, 13B. In FIG. 6, maximum power is provided at output 12 when switch halves A, B operate in phase or at zero degrees phase, and minimum power is provided at output 12 when circuit halves A, B operate out of phase or at 180 degrees phase. In the circuit of FIG. 6, inductors L1A and L1B must be matched to ensure zero output at 180 degrees phase.

Figure 7:
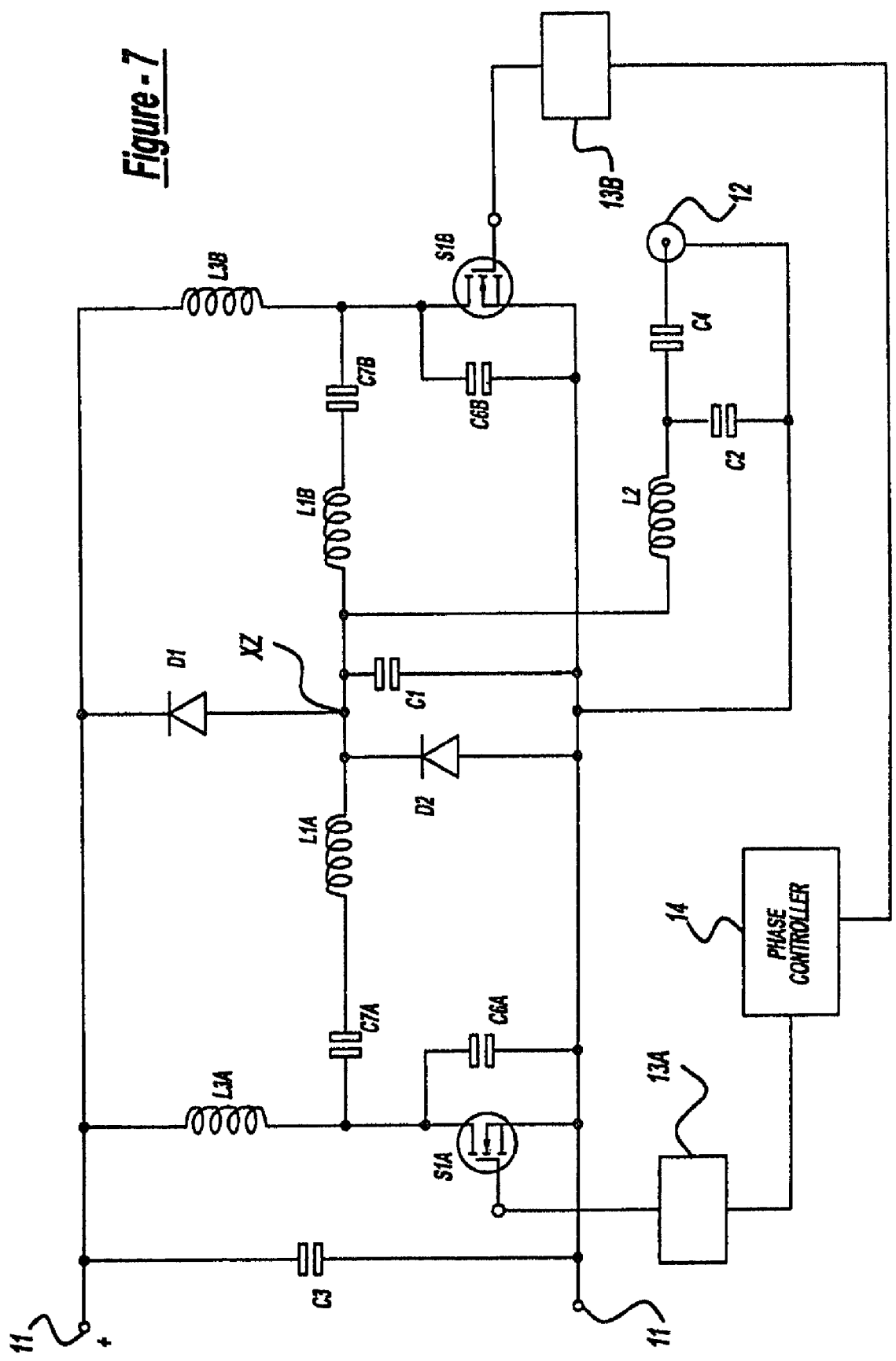
FIG. 7 is a related invention in which is a resonant circuit and single switch provide an output and in which a single diode clamping pair protects the circuit.

FIG. 7 depicts a circuit having circuit halves A, B which are combined in parallel to provide an AC signal at output 12. With reference to circuit half A, switch S1A receives an AC signal from signal source 13A. Switch S1A is placed in series with a commutating inductor L3A between the respective negative and positive voltage rails of DC power source 11. A capacitor C6A is placed in parallel with switch S1A. Commutating inductor L3A and capacitor C6A cooperate to form a tank circuit so that circuit half A provides a single-ended inverter function. The tank circuit outputs a half-rectified sine waveform. A blocking capacitor C7A removes DC components from the signal output from switch S1A and commutating inductor L3A. Capacitor C7A couples the AC together and ensures the same AC voltage across each device, as will be seen in FIG. 8. Note that L3A and L3B can be cross coupled to promote equal sharing. The ratio inductors L3A to L1A determines the variation of stress of switch S1A. If the current through inductor L3A is relatively large compared to that through inductor L1A then the variation due to the load through inductor L1A will have a limited effect on the stress on switch S1A. The circuit of FIG. 7 has the disadvantage that even harmonics are generated and the DC voltage across C7A has some dependence on the load. This means a transient charging current may flow under some load changes. Output from blocking capacitor C7A is input to inductor L1A.

Second switch half B includes a switch S1B driven by an AC signal output by signal source 13B. Switch S1B is in series with commutating inductor L3B between the respective negative and positive rails of DC input source 11. A capacitor C6B is placed in parallel with switch S1B. Commutating inductor L3B and capacitor C6B form a tank circuit. The output from switch S1B and inductor L3B is applied to blocking capacitor C7B, which removes DC components from the signal. Inductor L1B connects to capacitor C7B.

Inductors L1A and L1B interconnect at node XZ and provide an output to inductor L2 and capacitor C2. The other terminal capacitor C2 is connected to the negative rail of DC voltage source 11. A capacitor C1 is connected between the negative rail of DC voltage source 11 and node XZ. Accordingly, inductors L1A, L2 and capacitors C1, C2 from a two-stage harmonic filter for the output from circuit half A. Similarly, inductors L1B, L2 and capacitors C1, C2 form a two-stage harmonic filter for the output from circuit half B. Blocking capacitor C4 removes DC components from the signal provided at output 12.

FIG. 7 also includes a pair of clamping diodes D1, D2 arranged in series between the respective positive and negative rails of voltage source 11. The negative terminal or cathode of diode D1 connects to the positive rail of DC source 11, and the positive terminal or cathode of diode D1 connects to node XZ. The negative terminal or cathode of diode D2 connects to node XZ, and the positive terminal or anode of diode D2 connects to the negative rail of DC source 11.

When either circuit half A, B attempts to drive the voltage at node XZ above a predetermined threshold, one of clamping diodes D1, D2 turns on, thereby providing a circuit path from node XZ back to DC source 11 and capacitor C3. For example, when the circuit of FIG. 7 attempts to drive node XZ to a voltage above the positive rail of DC source 11, diode D1 becomes conductive, thereby providing a circuit path for excess voltage and current back to DC input source 11 and capacitor C3. Similarly, when the circuit attempts to drive the voltage at node XZ below the voltage at the negative rail of DC input source 11, diode D2 becomes conductive, providing a circuit path back to DC input source 11 and capacitor C3.

The circuit halves A, B of FIG. 7 are arranged in a parallel configuration. When the relative phase of the control signals controlling switch S1A and switch S1B is in phase, or at 0 degrees, output 12 receives maximum power. Conversely, when the phase between the signals driving switch S1A and S1B are out of phase, or at 180 degrees, output 12 receives a minimum power. A phase controller 14 varies the relative phase between circuit halves A, B by providing an input to signal to each of signal sources 13A, 13B. The circuit components forming the harmonic filter in each circuit half A and B must be matched or equal to ensure 180 degree output phase. For example, L1A, L2A, C1A, and C2B should equal the values for L1B, L2B, C1B, and C2B.

A particular benefit of the circuit of FIG. 7 is that during operation at high frequencies, driving switches alternately within a same circuit path generally becomes more difficult. By utilizing a tank circuit formed by inductor L3 and associated capacitor C6, less precision is generally required of the switching on a particular circuit half.

Figure 8:
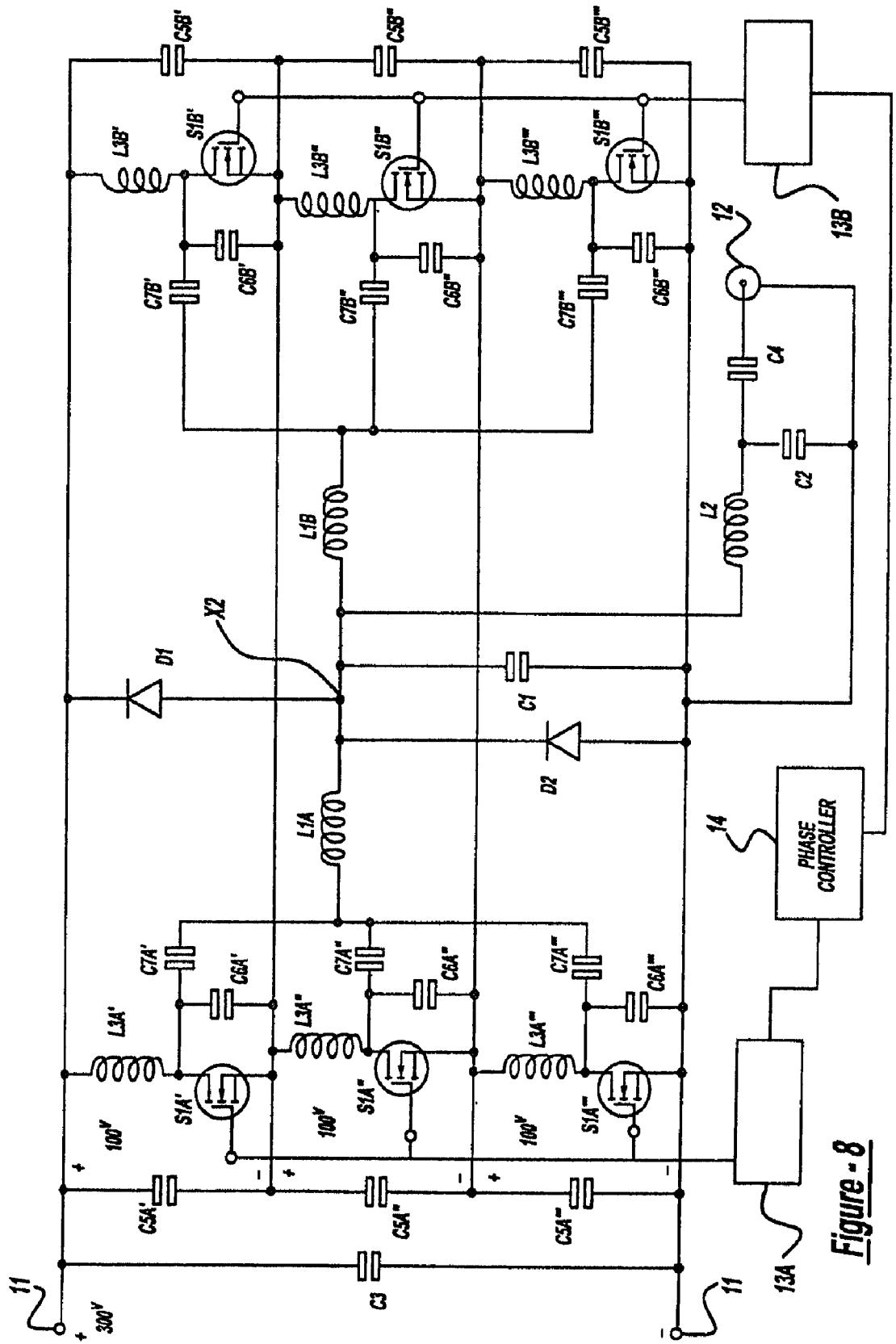
FIG. 8 is a three level implementation of the circuit of FIG. 7.

FIG. 8 depicts a three level implementation of the single-ended inverter circuit of FIG. 8. FIG. 8 includes a pair of circuit halves A, B, where each pair includes three levels designated by prime ('), double prime ("), and triple prime ("'). With reference to circuit half A, each level includes a switch S1A which receives an AC signal from signal source 13A. Switch S1A connects to an inductor L3A and is placed in parallel with the capacitor C6A. Inductor L3A and capacitor C6A cooperate to form a tank circuit. The output from inductor L3A and switch S1A is input to blocking capacitor C7A, which removes DC components from the output of conductor L3A and switch S1A. A capacitor C5A is placed in parallel with the series connection of switch S1A and inductor L3A. Each switch S1A', S1A", S1A"' receives analog signal from signal source 13A.

Capacitors C5A', C5A" C5A"' decouple the three levels. Each capacitor C5A', C5A", C5A"' passes current and blocks AC, thus providing a current loop for each DC portion of each stage. Capacitors C7A', C7A", C7A"' AC couple the outputs of each level together and have impedances which are negligible at the frequency of interest. Accordingly, each level has a voltage which is approximately equal. For example, if the voltage output by DC input source 11 is 300 volts, the voltage across each capacitor is 100 volts. Thus, each level of circuit half A must handle only ⅓ of the voltage output by DC source.

Similarly, circuit half B includes three levels, with each level having a switch S1B connected in series with an inductor L3B. Switch S1B is also connected in parallel with a capacitor C6B which forms a tank circuit with inductor L3B, as discussed above. A blocking capacitor C7B removes DC components from the output of inductor L3B and switch S1B. Each level is also connected in parallel with a capacitor C5B. The elements operate as described above with respect to circuit half A. Each switch S1B', S2B", S3B"' receives an AC signal from a signal generator 13B.

The output from the three levels of circuit half A is combined and input to inductor L1A. Inductor L1A cooperates to form a two-stage harmonic filter with inductor L2 and capacitors C1, C2 to remove harmonic components output from circuit half A. Similarly, the output from each level of circuit half B is combined and input to inductor L1B which also cooperates with inductor L2 and capacitors C1, C2 to form a two stage harmonic filter which removes harmonic components from the AC signal output from circuit half B. A blocking capacitor C4 is connected at the output of the harmonic filter to remove DC components in the signal provided to output 12.

FIG. 8 also includes a pair of clamping diodes D1, D2 arranged in series between the respective positive and negative voltage rails of DC input source 11. Clamping diodes D1, D2 cooperate to provide a circuit path back to DC source 11 and capacitor C3 when either circuit half attempts to drive node XZ beyond a predetermined threshold defined by the respective negative and positive rails of DC input source 11. In operation, when either circuit half attempts to drive node XZ to a voltage greater than the positive rail of DC input source 11, diode D1 turns on, creating a circuit path back to DC input source 11 and capacitor C3. Similarly, when either circuit half A, B attempts to drive the voltage at node XZ below the negative rail of DC input source 11, diode D2 turns on, creating a circuit path back to DC input source 11 and capacitor C3.

In operation, the relative phase between circuit halves A, B determines the power provided to output 12. When the relative phase between circuit halves A, B is 0 degrees or in phase, output 12 receives a maximum power. Conversely, when the relative phase between the AC signals driving the switches for the respective circuit halves A, B is 180 degrees, or out of phase, output 12 receives a minimum power.

A particular advantage of the circuit of FIG. 8 is that by placing three circuits in series between the respective negative and positive rails of voltage source 11, each level handles only one-third of the overall voltage across the respective negative and positive rails of DC source 11. This enables utilization of 400-500 volt devices for power supplies having DC input of approximately 300 volts, as only one-third of the input voltage is handled by each level, rather than the entirety of the voltage in a single level implementation. Such 400-500 volt devices are widely available and provide optimum characteristics for a 300 volt input system.

Figure 9:
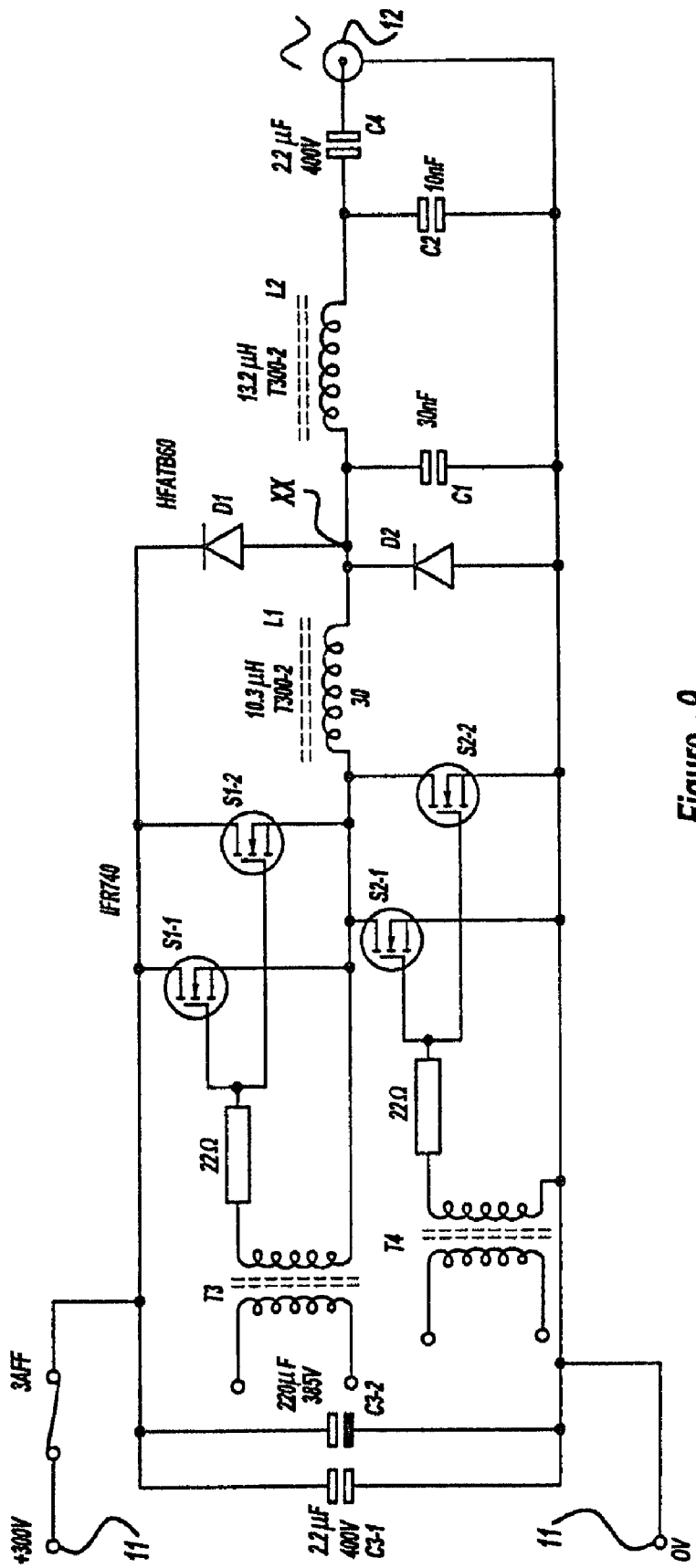
FIG. 9 is a related invention showing a half bridge inverter and a protection circuit.

FIG. 9 shows a circuit diagram for an inverter having a protection circuit. A DC voltage of 300 volts is applied across the voltage rails of the circuit of FIG. 9. A first capacitor C3-1 is embodied as a 2.2 microfarad ($\mu F$) capacitor having a 400 volt (V) capacity and a second capacitor C3-2 is embodied as a 220 $\mu F$ capacitor having a 380V capacity are placed in parallel between the voltage rails. A first AC signal is applied by a signal source (not shown) to the terminals of an isolation transformer T3. A second AC signal from the signal source (not shown) is applied to the input of a transformer T4.

The output from transformer T3 is input to a pair of switches S1-1, S1-2 through a 22 ohm (Ω) resistor. Similarly, the output from transformer T4 is input to a second switch pair S2-1, S2-2 through a 22 ohm (Ω) resistor. The switches are selected from an IRF740 package. The switch pair S1-1 and S1-2 are placed in parallel, as is the switch pair S2-1 and S2-2. Such parallel arrangement of the dual switches of a single switch pair reduces the current handling requirement of each switch. The output from the switch pairs S1, S2 is input to a 10.3 microhenry ($\mu H$) inductor L1 which cooperates with a 13.2 $\mu H$ inductor L2 and a 30 nanofarad ($\eta F$) capacitor C1 and a 10 $\eta F$ capacitor C2 to provide a four element harmonic filter for removing harmonics from the output of switches S1, S2. Blocking capacitor C4 is embodied as a 2.2 $\mu F$ capacitor having a 400V capacity.

Clamping diodes D1 and D2 are arranged in series between the respective positive and negative rails of voltage of DC source 11. Clamping diodes D1, D2 are preferably selected from a package HFAT660.

The circuits described above typically operate over a limited range of frequency. Because the LC networks are generally low pass filters, maximum power throughput varies inversely with frequency. Also, as the frequency decreases, distortion from the harmonics will start to appear. Satisfactory operation over at least a 30% bandwidth has been observed.

Other circuits exist having a voltage source inverter feeding a multiple LC network where clamp diodes may be connected between the network and DC voltage source. While half bridge inverter circuits are illustrated, it should be understood that full bridge and single ended inverters are also included. The LC network values and clamp point are preferably, as described herein, advantageously selected so that excessive circulating energy can be returned to the supply, preventing the build-up of excessive current and voltage, thereby protecting the components. In addition such a selection may ensure that the current always looks inductive at the source inverter, addressing diode recovery considerations. Transformers may be included in such a network to help match the output, clamp point, and inverter transistors or to provide isolation.

Further, two voltage source inverters may be connected to a network described herein so that the power level may be controlled by the phase relationship. In addition to the phase relationships described herein, non-symmetrical networks will lead to more complex phase relationships. Symmetrical networks offer the advantage that maximum and minimum power phases will not depend on frequency.

The above phase modulation circuits of the type described herein raise three potential design considerations.

First, under certain, limited conditions, DC power circulates from one bridge side to the other. When this occurs, although the FETs still see inductive turn off, when averaged over the whole cycle, the FETs are net rectifying. That is, more charge flows through the FET in a reverse rather than a forward direction. Consequently, if the current is high enough in reverse to turn on the body diode, the body diode will not be fully recovered when the transistor turns off, resulting in high power dissipation. This effect will be exaggerated by the negative temperature coefficient of the body diode voltage drop as the device heats up, potentially leading to thermal runaway.

This first consideration can be addressed at low frequencies by accepting the loss or by using reverse isolation diodes. At higher frequencies, the FETs should be selected to have sufficiently low resistance so that reverse current is always handled by the channel. This is easier to accomplish with low voltage devices because the on resistance is proportional to the voltage raised to the $2.5^{th}$ power, while the diode drop is independent of voltage.

Second, a high gain condition exists when the LC networks become resonant at low phase and are not clamped until the amplitude, and thus the forward power, of the output is relatively high. This condition will not likely harm the devices, but will affect the accuracy of control.

This second consideration can be addressed by utilizing very precise and stable phase controller or modulator design or by inserting resistors in the output network which will lower the Q and broaden the phase characteristic. Utilizing resistors that require just 1 or 2% of the 50 ohm power appears sufficient. This consideration only appears when there is no real power consumed at the load, such as may occur during the slightly artificial conditions of the load being purely reactive. Generally a plasma chamber, cable, and matching network will lower the Q sufficiently.

Third, the phase to power control characteristic may exhibit inflections or variations under various poor match conditions. For example, as the phase varies smoothly from zero to a maximum, the power increases from zero, decreases slightly, then continues to increase. This may cause oscillation in conjunction with the non-linear plasma impedance/power function.

This consideration is theoretical in its nature and may not be a practical consideration. The control algorithm may simply jump through the inflection, which typically disappears at matches better than 3:1 voltage standing wave ratio (VSWR). Also, the power control characteristic is inflection free for at least half of an infinite VSWR circle, so the load can be placed somewhere on the VSWR circle using cable length, pie networks, and the like. In practice, the circuit of FIG. 6 is superior to FIG. 4 in that the inflections are less pronounced and occur near maximum power which typically may not be reached in practice.

The circuits described herein utilize metal oxide semiconductor field effect transistors (MOSFETs). Although, MOSFETs are generally superior to bipolar junction transistors (BJTs) or insulated gage bipolar transistors (IGBTs) at the frequencies of likely interest greater than 1 megahertz (MHz).

Figure 10:
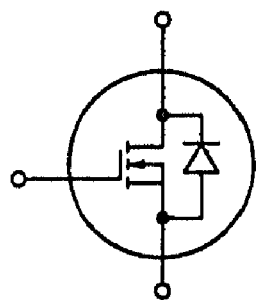
FIGS. 10-12 illustrate alternative configurations for switching devices, depending upon the particular switching device.
Figure 11:
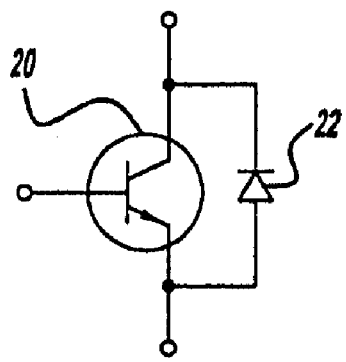
Figure 12:
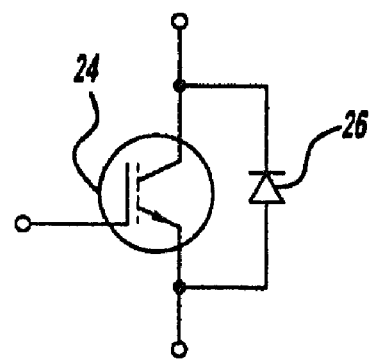

FIGS. 10-12 depict configurations for implementing switches in the circuits above using one of a MOSFET, BJT, or IGBT transistor. FIG. 10 shows a MOSFET as used in the circuits described above. The MOSFET includes a blocking diode which is inherent in the design of the MOSFET. FIG. 11, shows a BJT 20 and an anti-parallel diode 22. In the circuits described above, when implementing the switches using a BJT 20, an anti-parallel diode 22 must be included in order to provide a circuit path when the clamping diodes D1, D2 are active.

Similarly, FIG. 12 shows a preferred configuration when implementing the switches of the present invention utilizing an IGBT. FIG. 12 shows an IGBT 24 and an anti-parallel diode 26, which provides a similar function as anti-parallel diode 22 of FIG. 11. It should be noted that other switching devices or circuit combination providing a suitable switching and circuit path functions may also be used in the place of MOSFETs without altering the principles of the invention.

Figure 13:
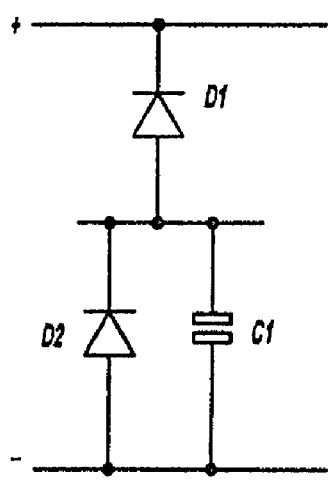
FIG. 13 is a circuit having a capacitor in parallel with one of the clamping diodes.
Figure 14:
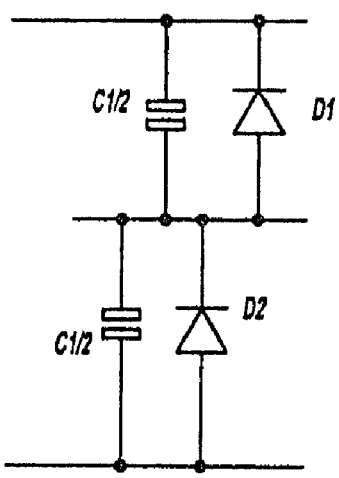
FIG. 14 is a circuit having a capacitor in parallel with each of the clamping diodes.
Figure 15:
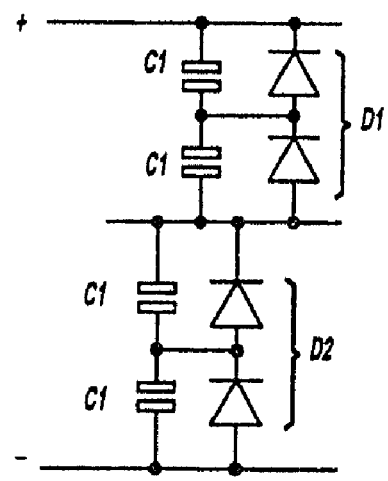
FIG. 15 is a circuit having a voltage divided across a series of capacitors and diodes.

FIGS. 13-15 depict alternative diode clamping circuits described with respect to D1, D2. FIG. 13 depicts a diode clamping circuit including diodes D1, D2 and capacitor C1. This circuit has been described above. FIGS. 14 and 15 show implementations using alternate configurations of the diodes D1, D2 and capacitor C1. In each circuit, capacitor C1 may be implemented utilizing two identical capacitors of half the value placed across each diode, as shown in FIG. 14. Capacitors C1/2 are effectively in parallel, coupled through decoupling capacitor C3 (not shown in FIG. 14). Decoupling capacitor C3 is made large relative to the operating frequency so its impedance is negligible, thereby assisting the circuit physical layout and component power sharing.

As shown in FIG. 15, at higher frequencies it may be advantageous to use two diodes in series for each diode D1, D2. Generally lower voltage diodes have lower reverse recovery charge. With two diodes in series, the same charge flows through each diode. Dividing C1 up across each diode ensures equal sharing of the AC voltage.

Figure 16:
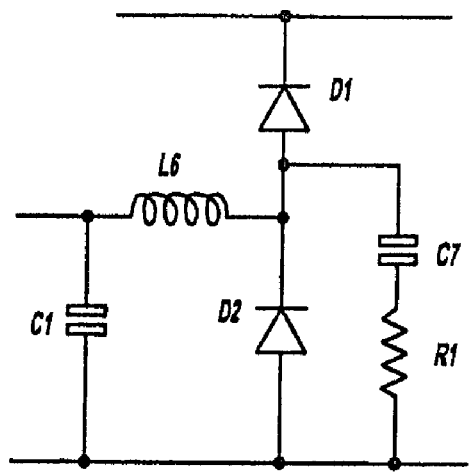
FIG. 16 is a circuit showing an inductance and RC circuit in the protection circuit.

As shown in FIG. 16, in a further variation of the clamping circuit, inductor L6 is placed in series with L1 and between the junction of the clamp diodes D1, D2 and filter capacitor C1. Inductor L6 is preferably of a small value. This can soften the diode turn on and off, increasing the efficiency of rectification. A snubber circuit formed by capacitor C7 and resistor R1 may be required to dampen high frequency ringing when diodes D1, D2 turn off. Correctly chosen, this will also contribute to reducing high Q situations if the LC network becomes resonant at low power output, such as where there is a low phase angle between the two parallel bridge circuits.

As discussed above, power control precision can be compromised as a result of a high gain condition existing if the LC filter networks become resonant at low phase and are not clamped until the amplitude, and thus the forward power, of the phase is increased. This can be addressed by a very precise and stable phase modulator design or by resistors connected in the output network and having a value sufficient to reduce the Q and broaden the phase characteristic. Consuming approximately 1-2% of the 50 ohm power appears sufficient to address this consideration. This typically only occurs where low power is consumed at the load, such as under the somewhat artificial condition of pure reactive loads in test conditions. In practice, cable, matching networks, and the load will sufficiently lower the Q. At larger phase shifts the clamping diodes prevent the resonance.

Figure 17:
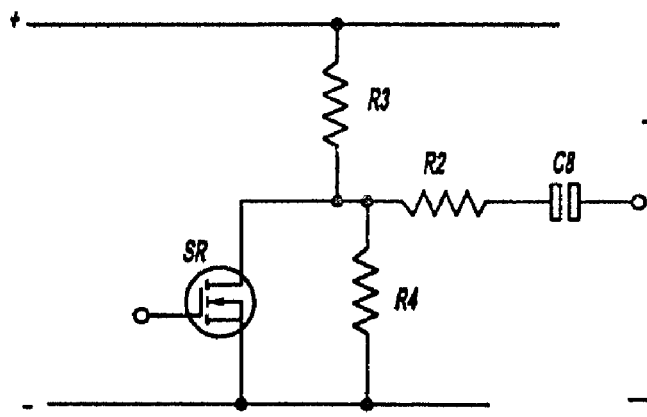
FIG. 17 shows a MOSFET circuit for improving operation of the filter network.

Alternatively, the Q may be selectively lowered by switching in resistors at the clamp point only when the phase is low. This may be achieved using a comparator on the phase modulator demand, set to come on for low values. This can then drive a relay, which may take the form of a MOSFET switch which is actuated when the phase difference is relatively low, such as in low power demand. FIG. 17 shows a circuit for selectively inserting resistors at the clamp point. As shown in FIG. 17, a MOSFET SR can be advantageously used because the voltage swing is limited by the clamp diodes and because a MOSFET will conduct in both directions. Bias resistors R3, R4 can center the voltage swing within the range of SR. R2 is chosen to provide sufficient damping, and C8 blocks DC from flowing through R2 and through the MOSFET SR. The input to SR typically is provided through a control circuit. The output from C8 is connected to the interconnection of diodes D1, D2.

Figure 18:
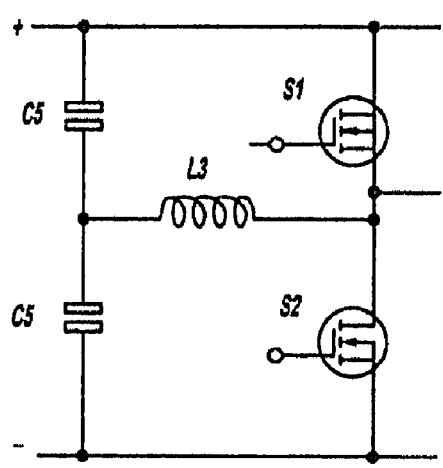
FIG. 18 is a circuit for an alternative input circuit for an inverter for addressing device capacitance.

As the operating frequency is increased the capacitance of FETs typically implementing the switches has a more significant effect on circuit operation. FIG. 18 shows an enhancement to a half bridge circuit.

In FIG. 18, capacitors C5 have been placed in parallel with capacitor C3 (not shown). An inductor L3 is inserted between the inter connection between capacitors C5 and the output of switches S1, S2. Inductor L3 ensures that sufficient inductive current always flows to charge and discharge the output and Miller capacitance of FETs S1, S2. Inductor L3 also ensures that the current appears inductive if the output and clamp network allows capacitive load current to flow.

As discussed above, DC power may circulate from one bridge side to the other under certain conditions. As a result, while the FETs S1, S2 still see inductive turn off, when averaged over a whole cycle, the FETs S1, S2 are net rectifying. That is, more charge flows in a reverse rather than a forward direction. Consequently, if the current is high enough to reverse and turn on the body diode contained within the FET, the FET switch will not be fully recovered when the transistor of the FET turns off, and high power dissipation will result. This will be exaggerated by the negative temperature coefficient of the body diode voltage drop as the FET device heats up, potentially leading to thermal run away.

As also discussed above, at low frequencies this condition can be addressed by accepting the loss, or using reverse isolation diodes. At higher frequencies the FETs should be selected to have sufficiently low enough on resistance so that the reverse current is always handled by the FET channel. This is easier to accomplish with low voltage devices because the on resistance is proportional to the voltage raised to the 2.5th power while diode drop is independent of voltage.

Figure 19:
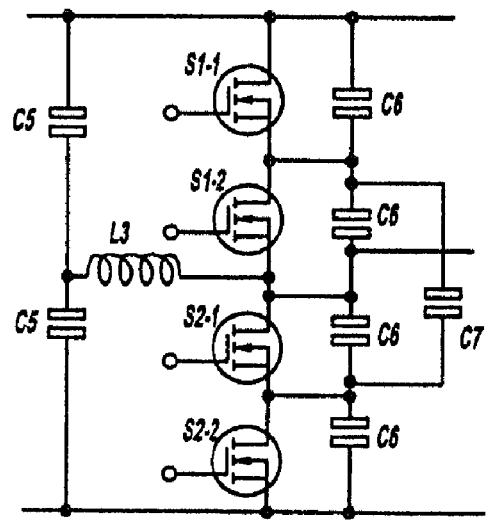
FIG. 19 shows an inverter circuit for addressing device capacitance implemented using multiple FETs.

As shown in FIG. 19, two lower voltage FETs S1-1, S1-2 and S2-1, S2-2 may be connected in series. These FETs will typically have one quarter of the on resistance compared to two FET devices in parallel and will drop half the voltage through each. Thus, the threshold current for diode construction will double. In FIG. 19, capacitors C6 may be placed in parallel with each switch S1-1, S1-2, S2-1, S2-2. Capacitors C6 may be required to ensure equal voltage sharing, but also add to the effective device capacitance. A capacitor C7 further promotes equal voltage sharing and only passes imbalance currents. In this configuration, fast recovery epitaxial diode (FREDFET) switches may offer advantages due to their reduced reverse recovery charge.

Figure 20:
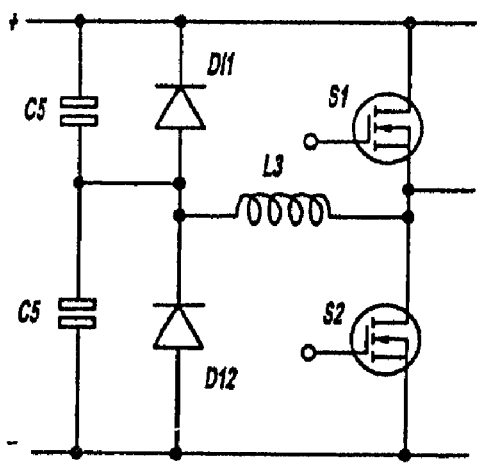
FIG. 20 is an improvement to the input circuit of FIG. 18.

FIG. 20 shows yet another improvement to the circuit of FIG. 18. Two clamp diodes D11, D12 are inserted in parallel with each of capacitors C5. Diodes D11, D12 are selected to rectify current or voltage at the junction for return to the supply. This cycles inductive current as in FIG. 18 to commutate the capacitance of the FETs S1, S2 and also absorbs DC from the FETs S1, S2 and returns the DC to the supply rails. This can also handle any DC flowing from one bridge side to the other and thus also address FET body diode recovery considerations. Capacitors C5 and diodes D11, D12 may be configured in series and parallel combinations similarly to the main clamping arrangement, but typically require lower power handling capability. If a variable frequency of operation is desired the circuit FIG. 20 offers the additional advantage that the turn-off current remains approximately the same, independent of frequency, so long as L3 and C5 have been chosen so that diodes D11, D12 are always conducting.

Figure 21:
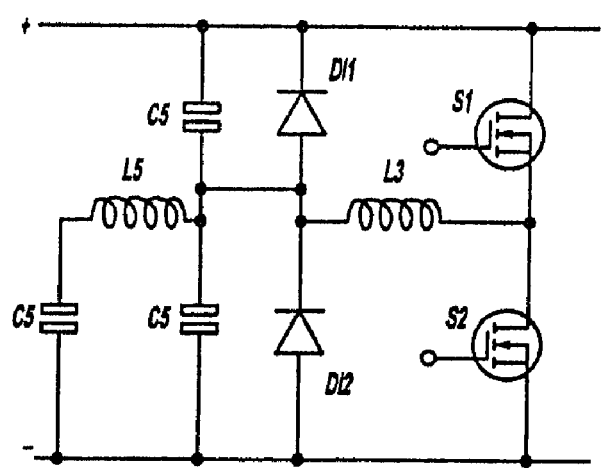
FIG. 21 shows an inverter having an additional LC series circuit.

An improvement to the circuit of FIG. 20 is shown in FIG. 21, which includes an additional LC series circuit including inductor LS and capacitor CS. By properly selecting the values of inductor LS and capacitor C5 so that the resonant frequency is between the primary frequency of the power supply and its third harmonic, the current through inductor L3 increases with frequency and maintains the DC current approximately constant.

Although negative and positive rails provide convenient reference voltages for clamping a predetermined point which is responsive to mismatch effects and also allows feeding back of the voltage and/or current to the inverter, it is also possible to connect the clamping diodes across some other, predetermined voltage source so that clamping occurs. Because the circuit must sometimes dissipate excess voltage and current, referencing an alternate voltage source preferably include referencing constant voltage sink.

Figure 22:
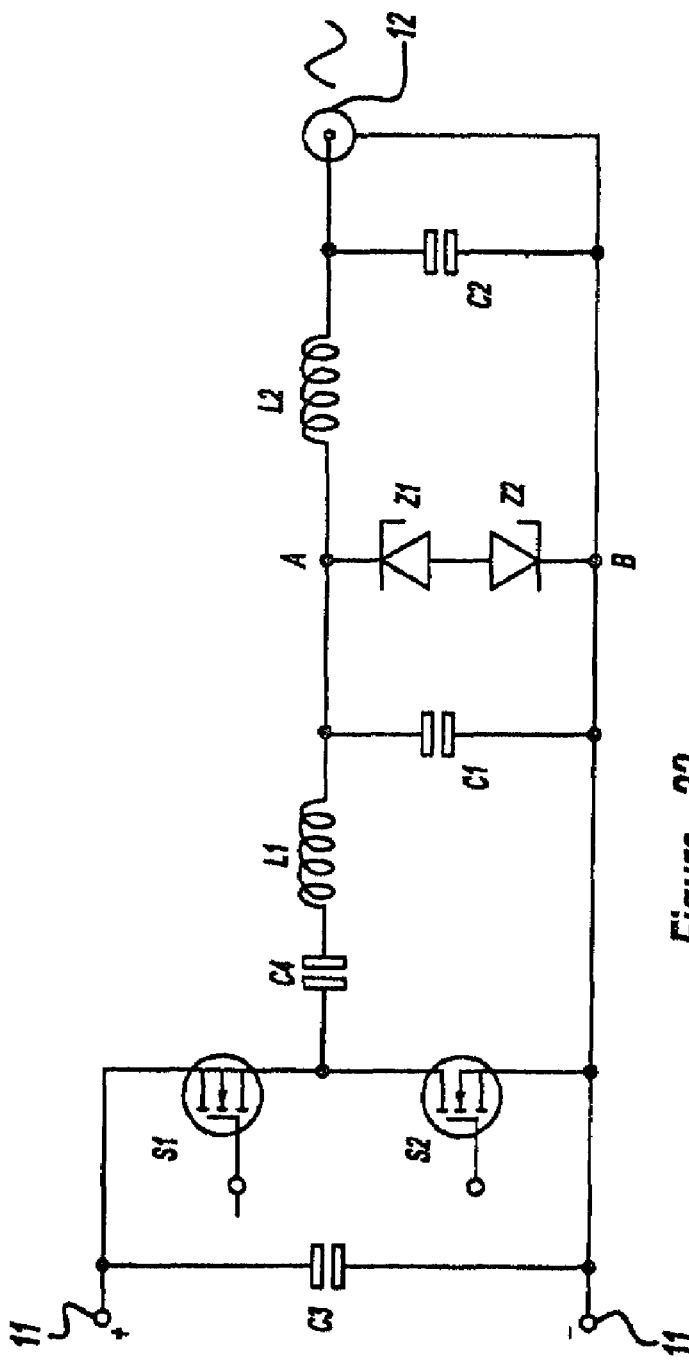
FIG. 22 illustrates a power supply circuit for varying the clamping voltage.

FIG. 22 illustrates a circuit referencing voltages other than the negative and positive voltage rails. A blocking capacitor C4 is inserted between the inductor L1 and the inverter switches S1, S2 so that Zener diodes Z1, Z2 set respective high and low voltage references for clamping. Zener diodes Z1, Z2 connect back to back in series between points A and B so that one will conduct and dissipate energy by heating if the voltage at point X is driven positive, and the other will conduct and dissipate energy if the voltage at point X is driven negative. One diode operates in a rectifier mode when the other device in a Zener mode.

Figure 23:
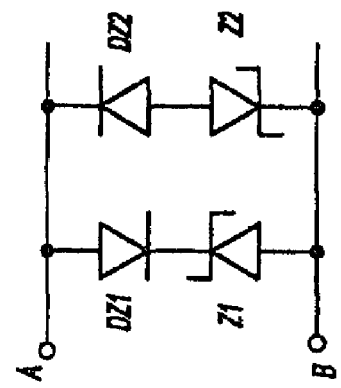

In practice the Zener diodes Z1, Z2 do not switch well at high speed. This condition may be compensated for by substituting the configuration of FIG. 23 for Zener diodes D1, D2. FIG. 23 includes Zener diodes Z1, Z2 each placed back to back in series with respective conventional diodes DZ1, DZ2.

The Zener/conventional diode series connections are then placed in parallel. In this configuration, Zeners diodes Z1, Z2 need not operate in a rectifying mode.

A further consideration is that Zener diodes are not currently available in particularly high power ratings. Presently the maximum power rating for a Zener diode is approximately 70 W. Further, Zener diodes which do have a relatively high power rating are typically expensive. Transistors, however, are relatively inexpensive and readily available in very high power ratings. One way to overcome the limitations of Zeners is to use an active Zener circuit such as shown in FIG. 24. In FIG. 24, the Zener diode ZA primarily functions to turn on a transistor TA which is configured for dissipating higher power levels, approximately 100 times that of Zener diode ZA. The power dissipation in transistor TA is a function of the gain of the active Zener circuit.

With reference to FIG. 24, when diode ZA is in a Zener mode, the following equations apply:

$$V = V_2 + V_{BE}, \text{ where } V_{BE} \approx 0.6v$$

$$I = I^2 + I_Q, \text{ where } I_Q \approx HFE \times I_2 \text{ and } HFE \approx 100$$

so that $I_Q >> I_2$, and $P_Q >> P_2$.

As can be seen from the equations above, the current through transistor TA is much greater than the current through Zener diode ZA, and the power dissipated by transistor TA is much greater than the power dissipated by the Zener diode ZA.

FIG. 25 depicts an alternate arrangement for setting a voltage reference other than the negative and positive rails of the inverter. In particular, FIG. 25 shows a diode bridge comprising diodes DB1A, DB2A, DB1B, DB2B. A Zener ZB is connected across the halves of the diode bridge. Accordingly, whether for a negative wave or positive wave, Zener diode ZB enters Zener mode when the voltage exceeds the threshold voltage. FIG. 26 depicts a diode bridge arrangement similar to FIG. 25, but includes a transistor TA and Zener diode ZA arrangement similar to FIG. 24, thereby providing increased power dissipation.

The diode bridge circuits of FIGS. 24-26 provide several advantages. First, the design reduces cost because only one Zener diode must be used, rather than two. Second, because only one Zener diode is used, consistent clamping voltages may be obtained, rather than possibly inconsistent clamping voltages obtained using a two Zener diode arrangement. Third, conventional diodes are much more easily matched than the Zener diodes.

Figure 27:
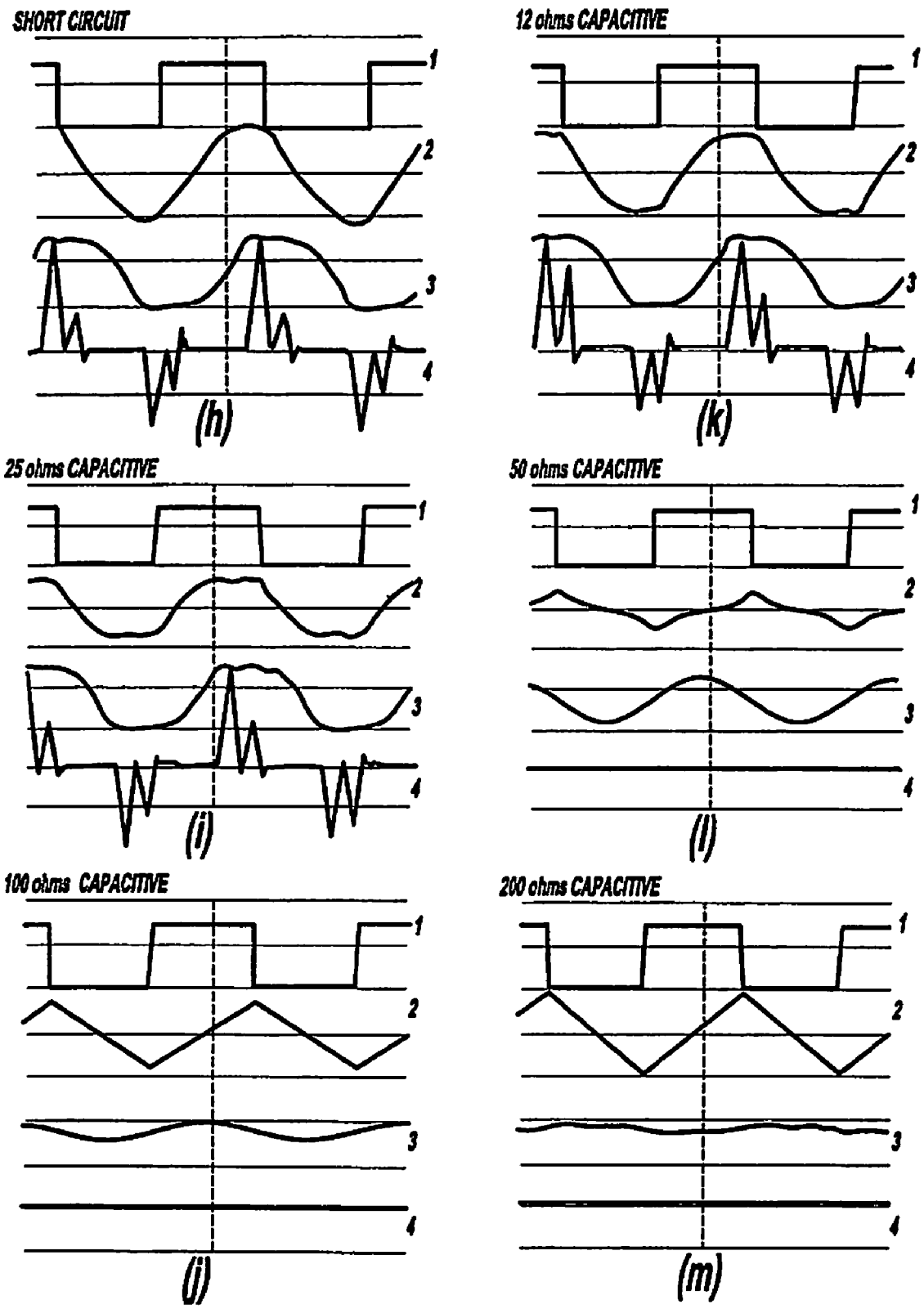
FIGS. 27a-27m illustrate waveforms taken from an exemplary half bridge inverter incorporating a protection circuit.

FIG. 27 shows waveforms measured for an exemplary circuit implementation of a power supply having a protection circuit. Operating waveforms and power levels were recorded for 300V DC input under matched and mismatched conditions. The load impedances matched at 50 ohms and mismatched using open circuit, short-circuit, and 12, 25, 50, 100 and 200 ohms both inductive and capacitive reactive. With reference to FIG. 27a-m, each figure includes four waveforms, labeled 1-4 in each figure. Waveform 1 indicates the drain voltage of the MOSFETs, such as the output input of inductor L1, at 200 volts per division. Waveform 2 indicates the current through L1, at 10 amps per division. Waveform 3 is the clamp voltage or voltage at the node between diodes D1, D2, at approximately 200 volts per division. Waveform 4 is the clamping diode current, at 10 amp per division. These conventions apply to each of the output waveforms of FIGS. 27 and 28. The selected values provide 12 discreet points at infinite VSWR sufficient to ensure worst operating conditions are found. The table below lists th key parameters:

|  | Load | DC Current (Amps) | RF Forward Power (Watts) | Power Dissipation (Watts) | Peak FET Current (Amps) | Diode Current (Amps) |
|---|---|---|---|---|---|---|
|  | 50 ohms | 1.71 | 465 | 48 | 10 | 4 |
|  | Open Ckt. | 0.109 | 138 | 33 | 10 | 0 |
| Inductive | 200 ohm | 0.139 | 145 | 42 | 12 | 0 |
|  | 100 | 0.162 | 157 | 49 | 13 | 0 |
|  | 50 | 0.226 | 176 | 68 | 14 | 10 |
|  | 25 | 0.240 | 155 | 72 | 14 | 18 |
|  | 12 | 0.242 | 149 | 73 | 13 | 23 |
|  | Short Ckt. | 0.204 | 202 | 61 | 10 | 24 |
| Capacitive | 12 ohm | 0.184 | 231 | 55 | 9 | 23 |
|  | 25 | 0.173 | 342 | 52 | 7 | 23 |
|  | 50 | 0.071 | 300 | 22 | 4 | 0 |
|  | 100 | 0.073 | 190 | 22 | 7 | 0 |
|  | 200 | 0.088 | 150 | 26 | 9 | 0 |

As the load rotates from open circuit to short circuit inductively, then back again capacitively, the FET currents are maintained inductive and are less than 40% higher than the 50 ohm value. DC current consumption is only a one-sixth of the 50 ohm value. The clamping diodes D1, D2 can be seen to conduct slightly with a 50 ohm load, which could be eliminated by slightly retuning the network. This, however, is not critical to efficiency or effective protection.

Figure 28:
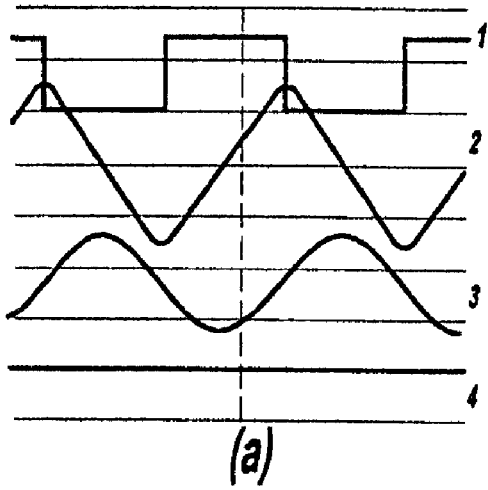
FIGS. 28a-28f illustrate comparative waveforms from an exemplary half bridge inverter not incorporating a protection circuit.
Figure 28:
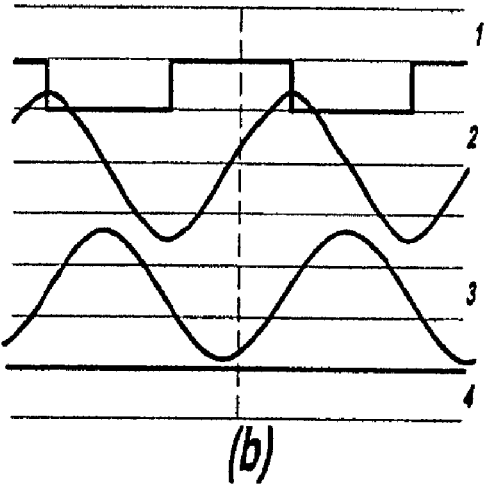
Figure 28:
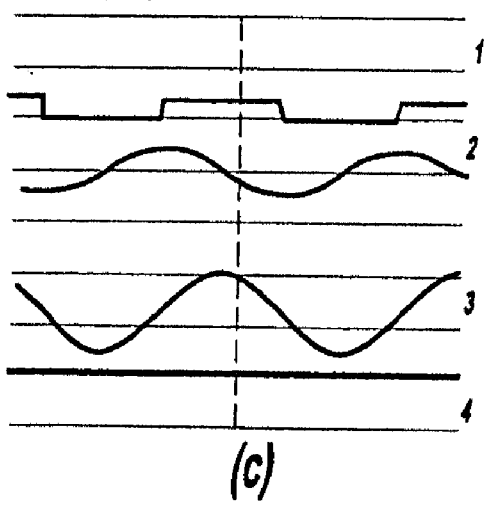
Figure 28:
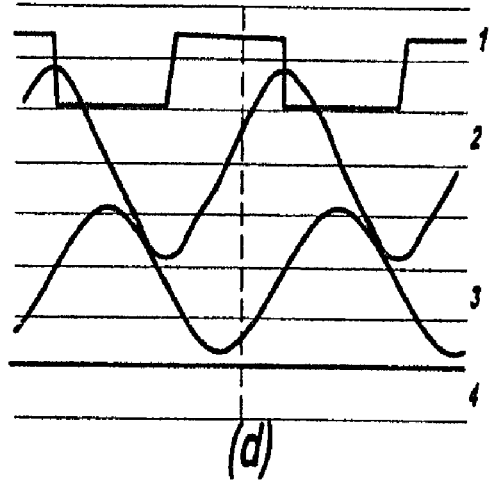
Figure 28:
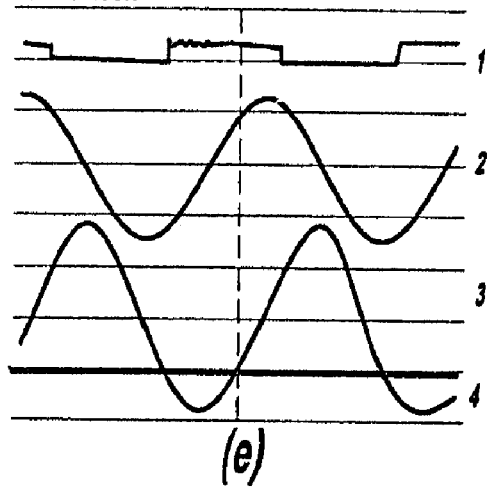
Figure 28:
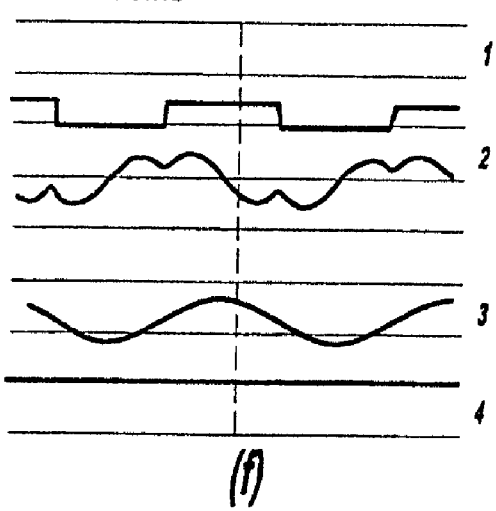

By way of contrast, FIG. 28 depicts output waveforms for a 375 KHz half bridge inverter implemented without the clamp circuit. During the testing, the test device was protected to avoid device destruction by manually reducing the supply voltage. The table below lists the key parameters. Protection now is accomplished by reducing the supply voltage.

|  | Load | DC Current (Amps) | RF Forward Power (Watts) | Power Dissipation (Watts) | Peak FET Current (Amps) |
|---|---|---|---|---|---|
|  | 50 ohms | 1.86 | 514 | 44 | 10 |
| Inductive | 50 ohm | 0.25 | 241 | 75 | 15 |
|  | 25 | 0.41 | 424 | 124 | 18 |
|  | 12 | 0.36 @ 200 V | 331 | 73 | 14 |

-continued

|  |  | DC Current (Amps) | RF Forward Power (Watts) | Power Dissipation (Watts) | Peak FET Current (Amps) |
| --- | --- | --- | --- | --- | --- |
|  | Short Ckt. | 2.15 @ 42 V | 752 | 90 | 14 |
| Capacitive | 12 ohm | 0.46 @ 40 V | 53 | 23 | 2.0 |
|  | 25 | 0.12 @ 50 V | 21 | 6 | 0.5 |

As the inductive load impedance is reduced, the FET currents become larger. If at 12 ohms the supply was maintained at 300V, forward power would have reached 750 W, more than the 50 ohm value. At short circuit, 750 W is produced from only 42V, with L1 resonant with the rest of the network. At 300V, forward RF power would be some 38 KW, DC power 4.6 KW and the peak transistor current 100 A.

As the load swings capacitive and the impedance starts to rise, the FETs see a capacitive load. This condition can be more problematic than the high inductive currents seen before resonance because the FETs will suffer high diode recovery loss even though the currents are still modest. Further there also is a risk of commutating dv/dt failure. Note in the last three graphs the scales have been changed for clarity.

Figure 29:
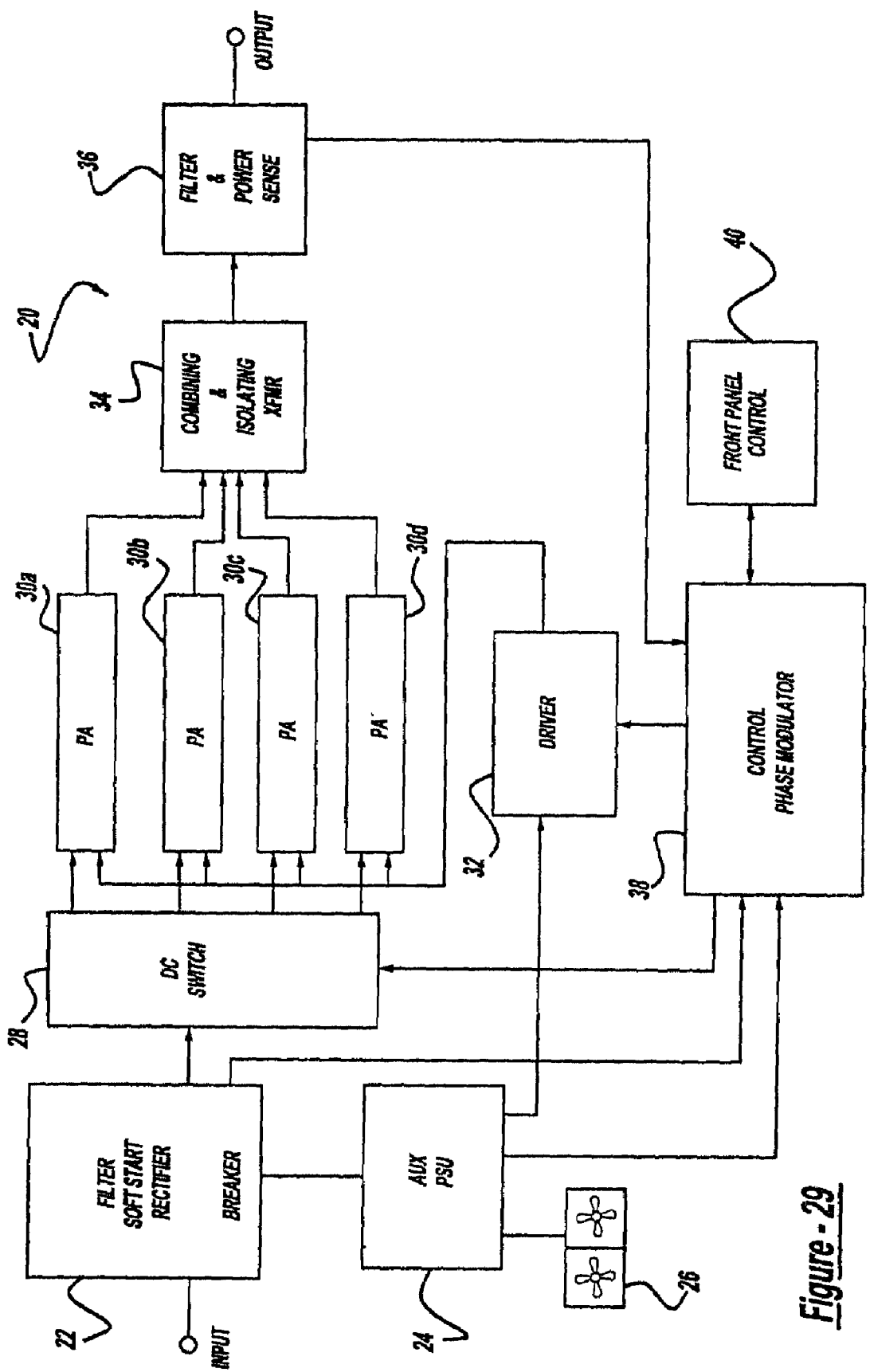
FIG. 29 is a block diagram of a control circuit for a power supply.

FIG. 29 depicts a control circuit for a power generator. Control circuit 20 includes a filter soft start rectifier 22 which receives an input voltage. Rectifier 22 may include a circuit breaker for overvoltage protection. An auxiliary power sense unit (PSU) 24 generates a lower voltage signal for powering control circuitry. A cooling fan 26 provides cooling to the generator circuit.

The output from the filter soft start rectifier 22 is applied to an optional DC switch 28 which controls the application of the DC voltage to a plurality of power amplifiers 30a, 30b, 30c, 30d. Four powers amplifiers 30a-30d are used in parallel in order to divide power handling across four amplifiers, rather than requiring one amplifier to handle the entirety of the power. Alternatively, one or many power amplifiers may carry out the function of power amplifiers 30a-30d. A driver circuit 32 generates switching signals to control the switching of each of the respective power amplifiers 30a-30d.

The output from power amplifiers 30a-30d is input to combining and isolating transformer 34 which combines each of the outputs from power amplifiers 30a-30d into one signal. Combining circuit 34 may include an isolation transformer to isolate the power amplifiers from the output. Combining isolation transformer 34 outputs the combined signal to a filter and power sense circuit 36 which filters the power signal prior to generating the output. The power sense portion of the circuit 36 provides a feedback signal to control phase modulator protection circuit 38.

Control phase modulator circuit 38 may be implemented using analog or digital electronics. The circuit 38 outputs a control signal to each of DC switch 28, driver 32, and front panel control 40. By varying the phase of switching of within each of the respective power amplifiers 30a-30d, the output power may be correspondingly varied. Accordingly, control phase modulator circuit 38 varies the phase of the power amplifier in accordance with input from the filter and power sense circuit 36. Front panel control circuit 40 provides information to the operator and also enables for variation of the desired phase and consequent output power.

Figure 30:
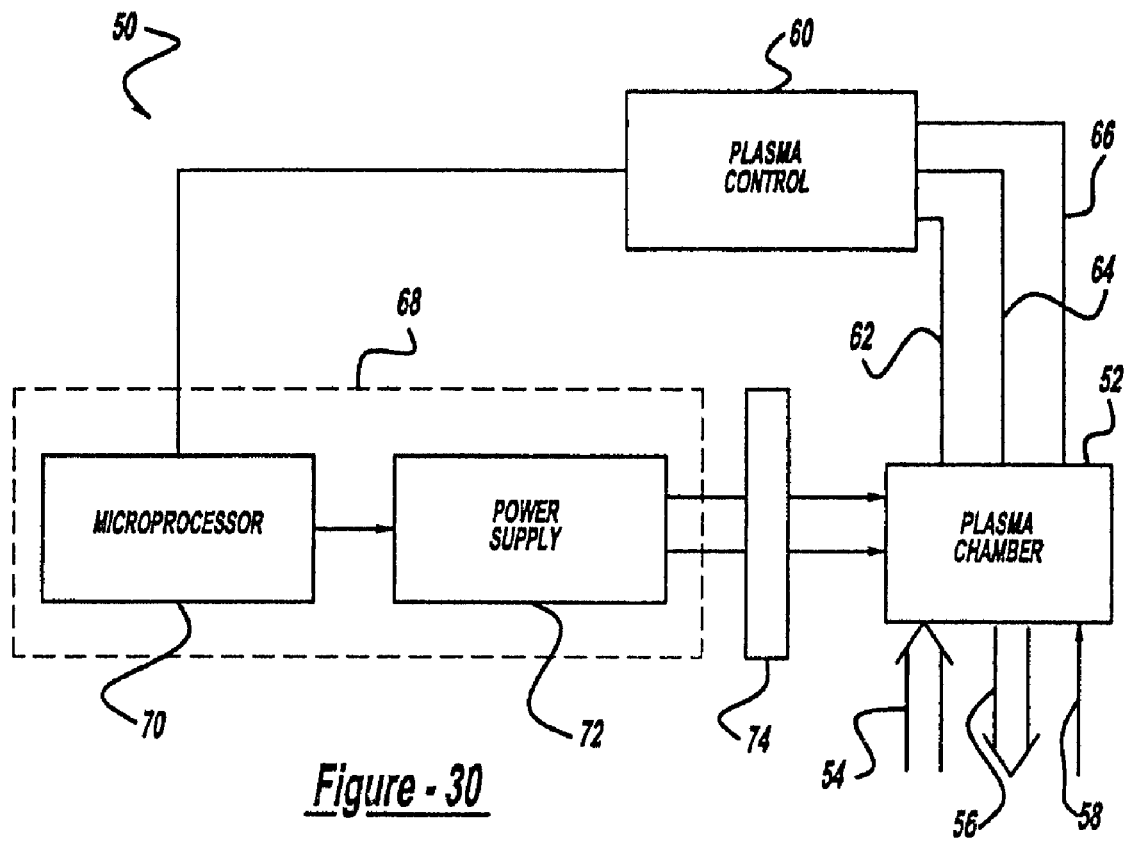
FIG. 30 is a block diagram for a plasma system utilizing a protection circuit.

FIG. 30 depicts a control system where selected power supplies described herein may be used in a system for controlling a plasma chamber. Control system 50 includes a plasma chamber 52, such as may be used for fabricating integrated circuits. Plasma chamber 52 includes one or a plurality of gas inlets 54 and one or a plurality of gas outlets 56. Gas inlets 54 and outlets 56 enable the introduction and evacuation of gas from the interior of plasma chamber 52. The temperature within plasma chamber 52 may be controlled through a heat control signal 58 applied to plasma chamber 52. A plasma controller 60 receives inputs from the plasma chamber including a vacuum signal 62 which indicates the level of vacuum in the chamber, a voltage signal 64, and a signal 66 indicating the ratio of flows between the inlet and outlet gases. As one skilled in the art will recognize, other inputs/outputs may also be received/generated by plasma controller 60. Plasma controller 60 determines a desired input power to be applied to plasma chamber through a voltage generator 68. Voltage generator 68 includes a microprocessor 70, or other similar controller, which receives the input signal from plasma controller 60. Microprocessor 70 generates control signals to power supply 72 which outputs a voltage signal at a desired frequency and power rating. The voltage output from power supply 72 is input to a matching network 74 which matches impedances between power supply 72 and plasma chamber 52.

Figure 31:
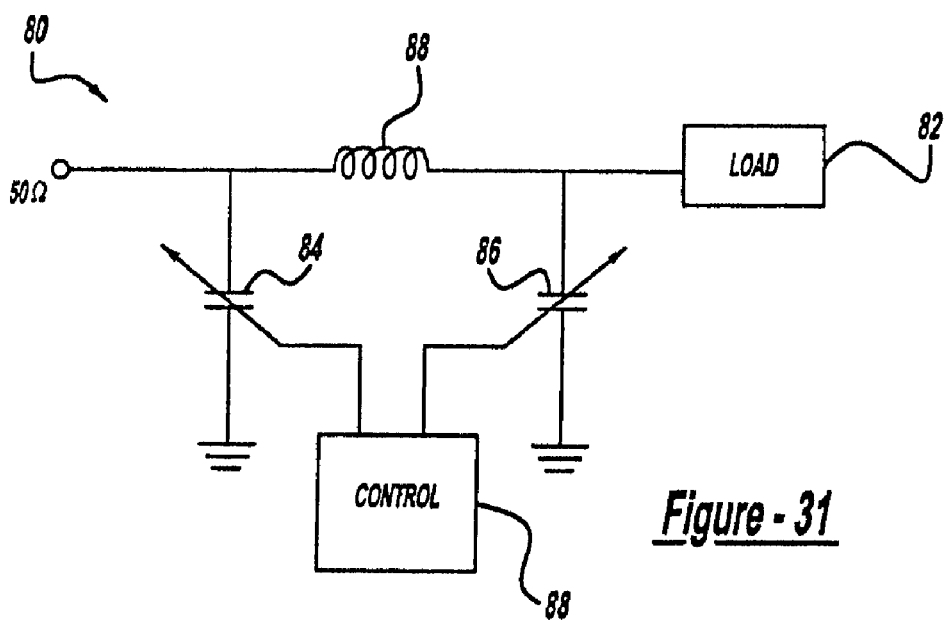
FIG. 31 is a matching network for the control circuit of FIG. 30.

FIG. 31 depicts a circuit for a matching network 80, such as may be implemented for matching network 70 of FIG. 30. Matching network 80 desirably matches a 50 ohm input impedance with the output impedance supplied by a load 82. Matching network 80 is configured in a pi filter topology, including a first variable capacitor 84, a second variable capacitor 86, and an inductor 88. Capacitors 84, 86 are implemented as variable capacitors, so that the capacitance of the filter network may be varied in order to properly match impedances between the 50 ohm input and the load 82. A controller 88 receives a feedback signal which varies in accordance with the impedance matched and generates control signals which vary the capacitances of respective capacitors 84, 86. One skilled in the art that will recognize other matching network configurations may also be implemented, such as transformers or fixed networks.

Figure 32:
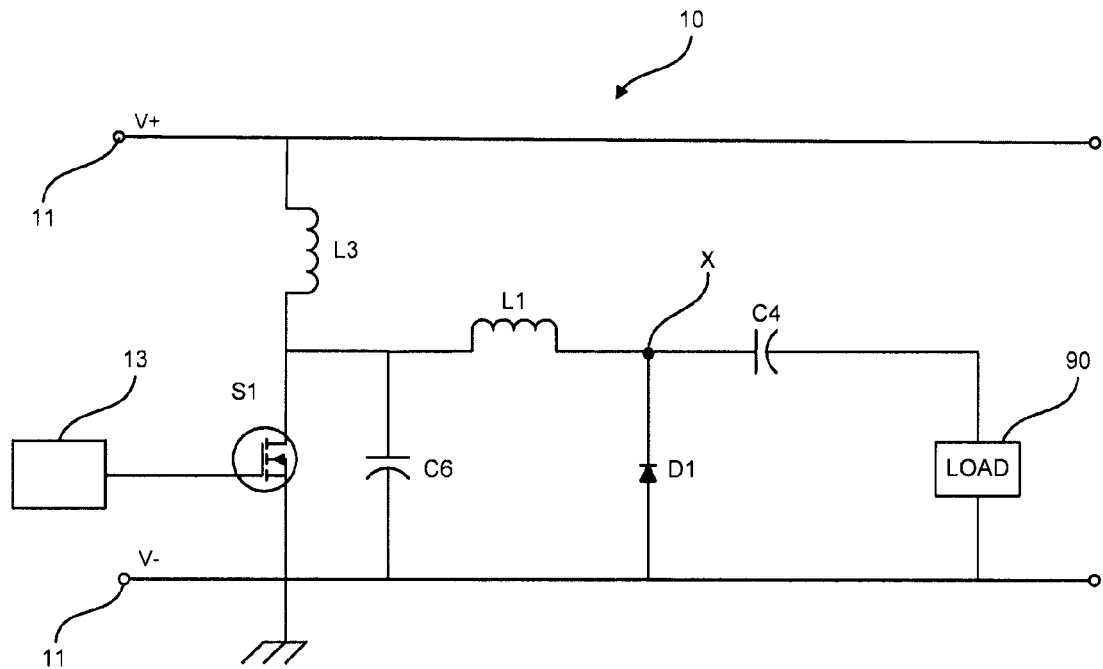
FIG. 32 is a circuit showing a single-ended amplifier arranged in accordance with the principles of the present invention.

With reference to FIG. 32, FIG. 32 depicts a single-ended, and more particularly a class E amplifier, arranged in accordance with the principles of the present invention. It should be noted that like reference numerals used in the specification will refer to components which perform similar operations. FIG. 32 depicts a switch or transistor S1 arranged in series with an inductor L3 between a pair of voltage rails V+ and V− of a DC power source 11. Switch S1 receives control signals from a signal source or generator 13. Switch S1 is arranged in parallel with a capacitor C6 which forms a parallel-resonant circuit with inductor L3. In combination, switch S1, inductor L3, and capacitor C6 cooperate to form a single-ended amplifier. At the output of the amplifier, inductor L1 and clamping diode D1 cooperate to form an inductive clamp circuit. The inductive clamp circuit is interposed between the output of switch S1 and a load 90 and operates similarly as described above with respect to FIGS. 1-31. Inductor L1 and capacitor C4 coordinate to form a harmonic filter at the output of switch S1 and provide a filtered signal to load 90.

Clamping diode D1 is interposed between the negative rail V− and node X. The anode of clamping diode D1 is connected to the negative voltage rail V−, and the cathode of clamping diode D1 is connected to node X. When the circuit of FIG. 32 attempts to drive node X beyond a predetermined threshold, diode D1 is turned on, thereby clamping the voltage at node X to a predetermined value, typically 2V volts, where V is the rail voltage.

In one configuration, the values of capacitor C6, inductor L1, and capacitor C4 are selected so that diode D1 does not conduct when the load is properly matched. The selection of such values reduces the generation of undesirable harmonics. In an alternate configuration, however, if the presence of harmonics is considered acceptable, the values may be selected so that diode D1 conducts even if the load is matched.

Diode D1 of FIG. 32 introduces some parasitic capacitance between the junction of inductor L1 and capacitor C4 and ground. If this capacitance becomes excessive, power delivery to load 90 may be compromised. With a slight modification to the circuit of FIG. 32, however, the parasitic capacitance of clamping diode D1 can be used advantageously.

Figure 33:
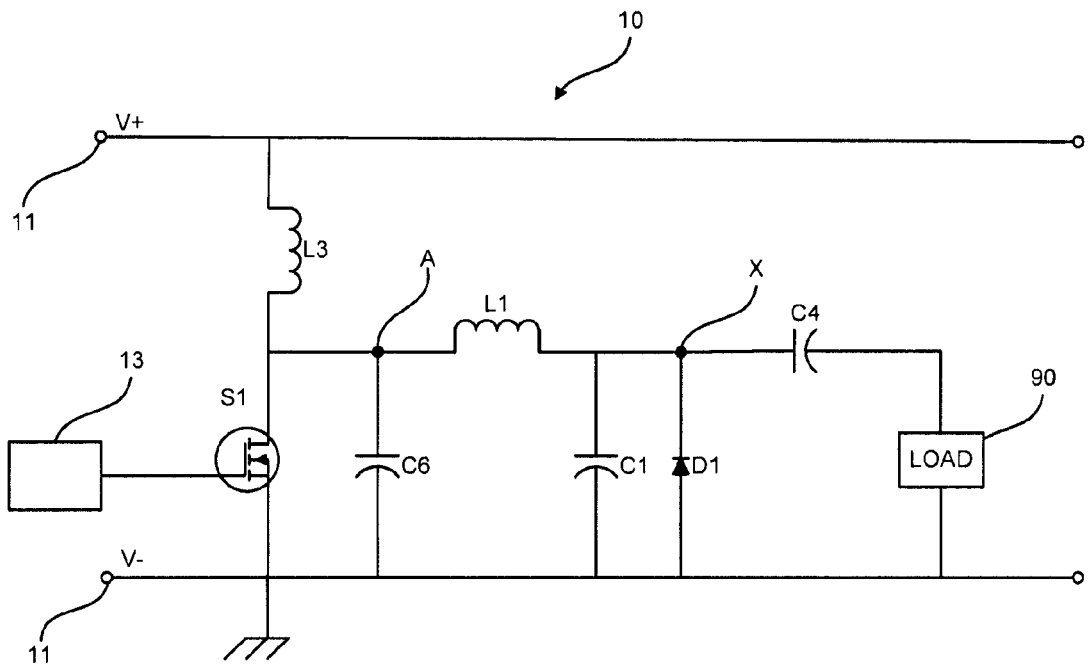
FIG. 33 is a circuit showing a second configuration for a single-ended amplifier arranged in accordance with the principles of the present invention.

With reference to FIG. 33, capacitor C1 is placed in parallel with diode D1, and the function of capacitor C4 is varied slightly. With this modification, capacitor C1 of FIG. 33 performs the function of capacitor C4 of FIG. 32. Capacitor C4 of FIG. 33 now provides a DC blocking capacitance and, consequently, should have a relatively high capacitance value. The circuit of FIG. 33 offers the additional benefit that the resonant frequency of inductor L1 and capacitor C1 can be the amplifier operating frequency. In this configuration, inductor L1 and capacitor C1 cooperate to form a harmonic filter at the output of switch S1. As described with respect to FIG. 32, the clamping diode D1 of FIG. 33 interconnects between the negative voltage rail V− and node X. When the circuit of FIG. 33 attempts to drive node X below a predetermined threshold, diode D1 turns on, thereby clamping the voltage at node X to a predetermined value, typically 2V volts.

Figure 34:
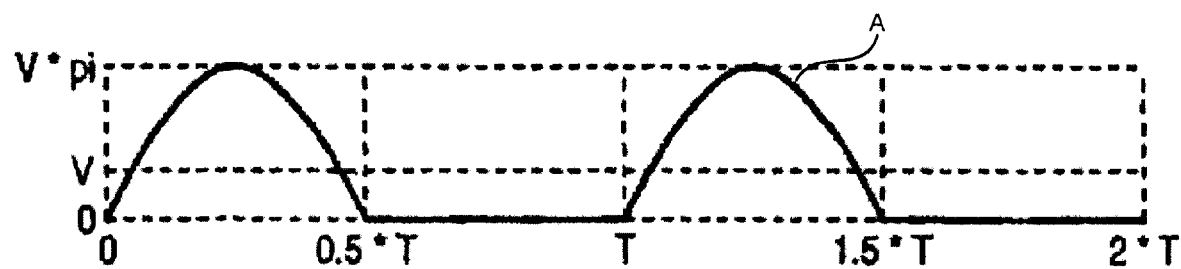
FIG. 34-36 are waveforms describing the operation of the circuit of FIG. 33.
Figure 35:
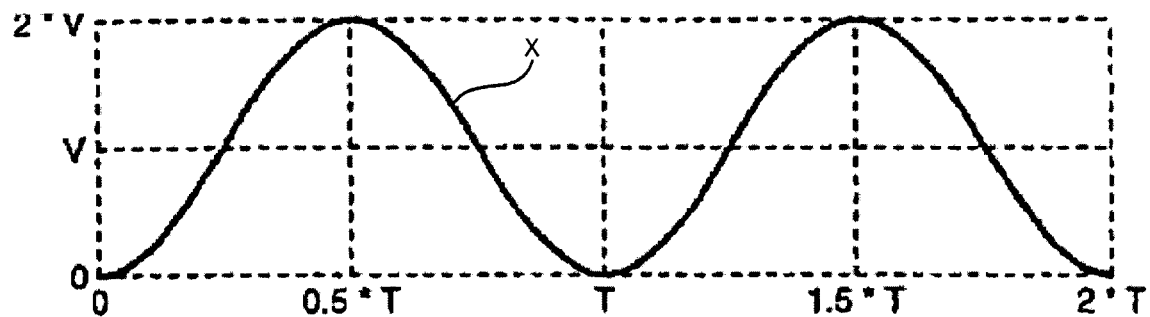
Figure 36:
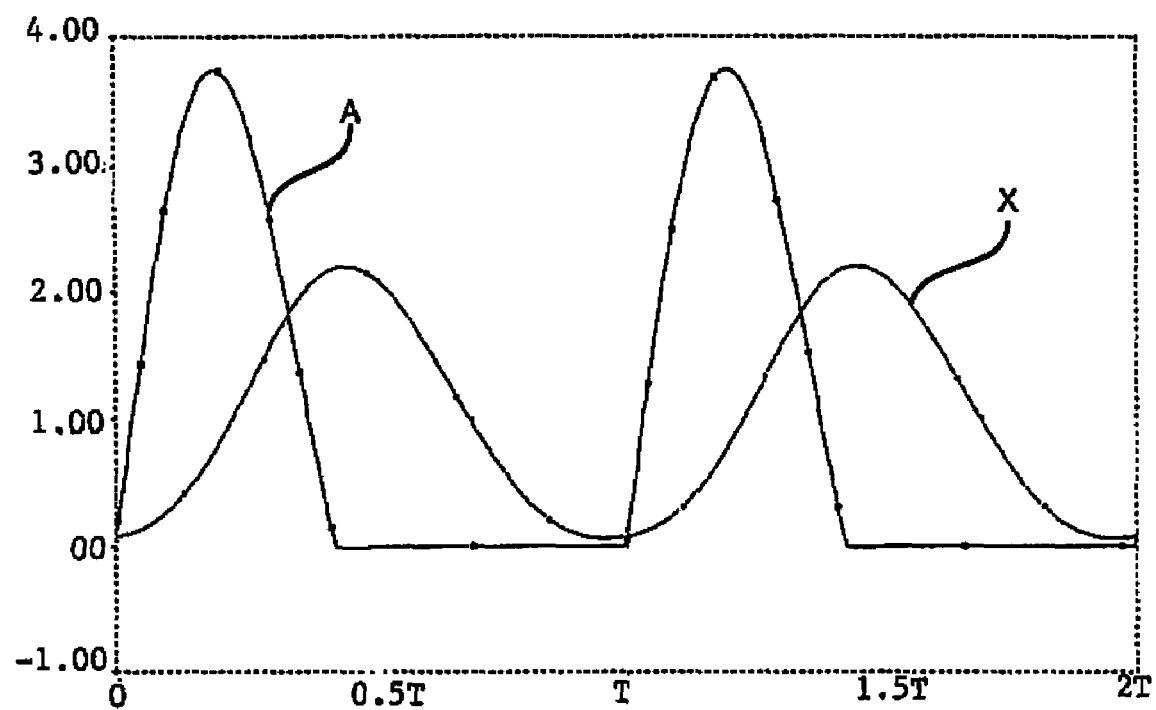

FIGS. 34-36 depict waveforms describing the operation of the circuit of FIG. 33. FIG. 34 depicts the expected waveform at node A of FIG. 33, and FIG. 35 depicts the expected waveform at node X of FIG. 33. As can be seen, the expected waveform at node A is a half-wave rectified sine wave. If the DC current through inductor L3 is constant, the peak voltage at node A will be $\pi$ times the DC rail voltage ($\pi \times V$). Preferably, the values of inductor L1 and capacitor C1 are chosen so that the voltage at the cathode of diode D1 (node X) approaches ground when the load is matched. Because the fundamental component of the voltage waveform at node A is $\pi \times V/2$, the characteristic impedance of inductor L1 and capacitor C2 is $\pi/2$ times the matched load impedance. This relationship is depicted in the waveforms of FIGS. 34 and 35. In operation, a substantial second (even) harmonic component is embedded in the waveform appearing at node A. Some of this second harmonic component is passed onto the waveform at node X. FIG. 36 depicts waveforms representative of the voltage at nodes A and X as determined by a simulation.

Figure 37:
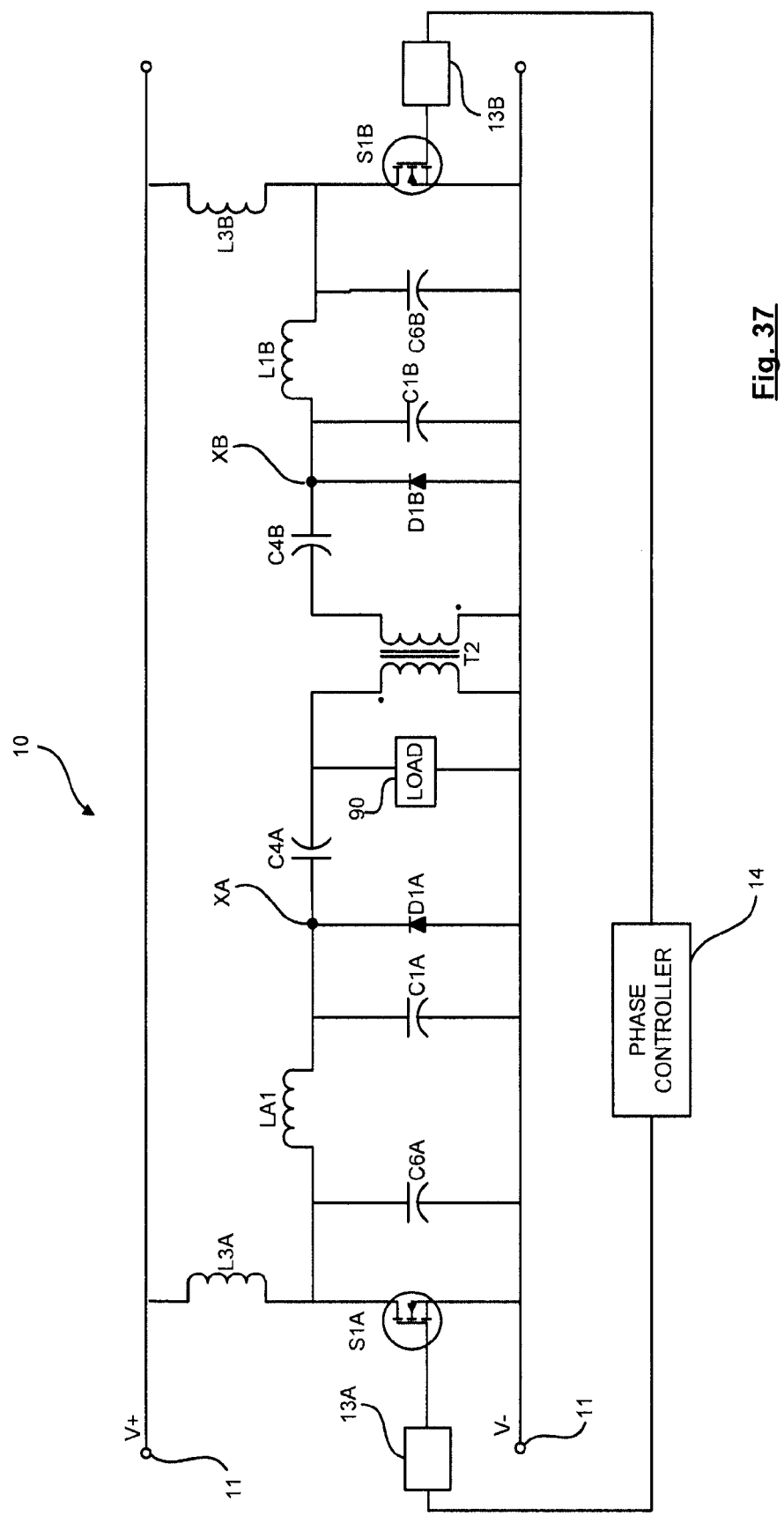
FIG. 37 is a circuit depicting a pair of single-ended amplifiers arranged in a push-pull configuration.

FIG. 37 depicts a configuration for addressing the even harmonics, as discussed with respect to the simulation waveform of FIG. 36, output by the class E amplifier. In particular, FIG. 37 depicts a pair of class E amplifiers, as depicted of FIG. 33, arranged in a push-pull configuration. It should be again noted that like reference numerals refer to similar components and such reference numerals may include additional suffix designators, such as A or B, to refer to components associated with respective halves of the parallel configuration.

FIG. 37 depicts a circuit having circuit halves A, B which are combined in parallel to provide an AC signal to load 90. Each circuit half A and B generally includes a class E amplifier configuration as described above with respect to FIG. 34. A transformer T2 joins each circuit half at the output of capacitor C4 in order to combine the output from each half A and B for application to the load 90. Switches S1A and S1B are driven 180 degrees out phase from each other in accordance with signals output by phase controller 14 to signal generators 13A, 13B. The output from respective capacitors C4A and C4B is joined via a transformer T2. Preferably, transformer T2 enables maximum coupling of each circuit half. Such maximum coupling enables control of the peak voltages at the respective cathodes (negative terminals) of diodes D1A and D1B, so that the voltage at each is clamped to two times the DC rail voltage.

Preferably, the coupling provided by transformer T2 insures balanced loading of both circuit halves and, consequently, both amplifiers. The matched load 90 of FIG. 37 is typically one-half the impedance of the matched impedance for just one of the two amplifiers. Designers typically prefer a higher output impedance rather than a lower output impedance. An optional balun may be added to the circuit of FIG. 37 to increase the matched load impedance by a factor of 4.

Figure 38:
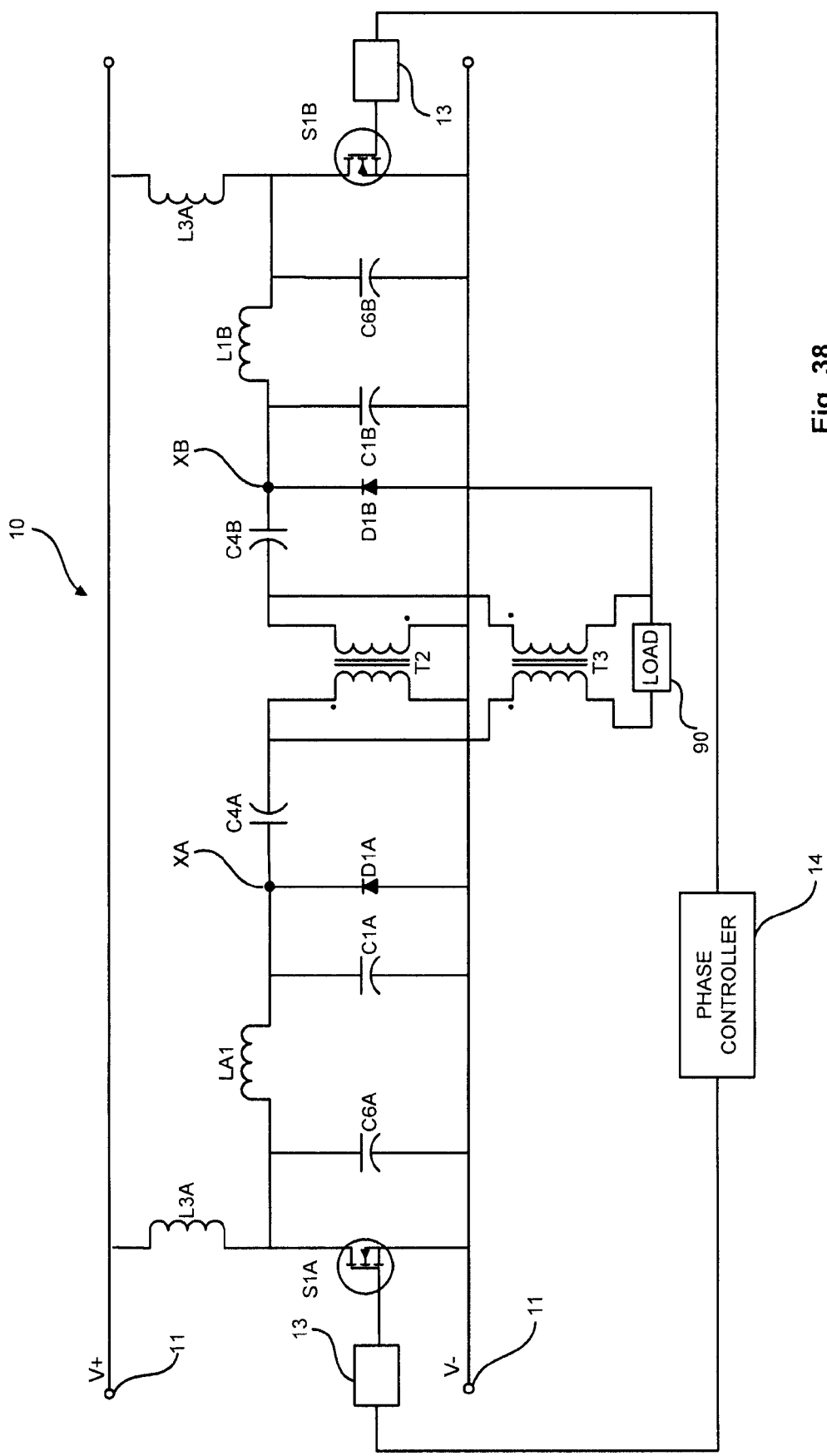
FIG. 38 is a circuit depicting a pair of single-ended amplifiers arranged in a push-pull configuration and including an additional circuit for balancing the load.

FIG. 38 depicts a modification to FIG. 37 to provide a higher output impedance. With reference to FIG. 38, FIG. 38 is arranged similarly to FIG. 37 with the addition of a transformer T3 arranged at the output of each respective circuit half. Accordingly, the transformer T2 of FIG. 38 has applied to it magnetizing current, even harmonic current, and diode current. Transformer T2 of FIG. 38 does not receive any load current. Accordingly, transformer T2 of FIG. 38 may be packaged considerably smaller than transformer T2 of FIG. 37. Further, the circuit of FIG. 38 can operate without transformer T2, but transformer T2 minimizes peak voltages across diodes D1A and D1B.

Designers typically select a class E amplifier configuration when frequency or phase modulation is used to send data. Amplitude modulation, on the other hand, presents certain challenges for a class E amplifier because the amplifier input must remain constant. One manner for implementing amplitude modulation, and output power control, is to vary the DC rail voltage. While varying the DC rail voltage proves effective with any amplifier, the inductive clamps described herein enable implementation of another control method.

An amplifier incorporating the inductive clamp as described herein can operate with virtually any load without damage to the switches. Accordingly, it is possible to combine two or more of these amplifiers in either a parallel and/or series push-pull configuration. Output power may then be controlled by varying the phase difference between the amplifiers.

Figure 39:
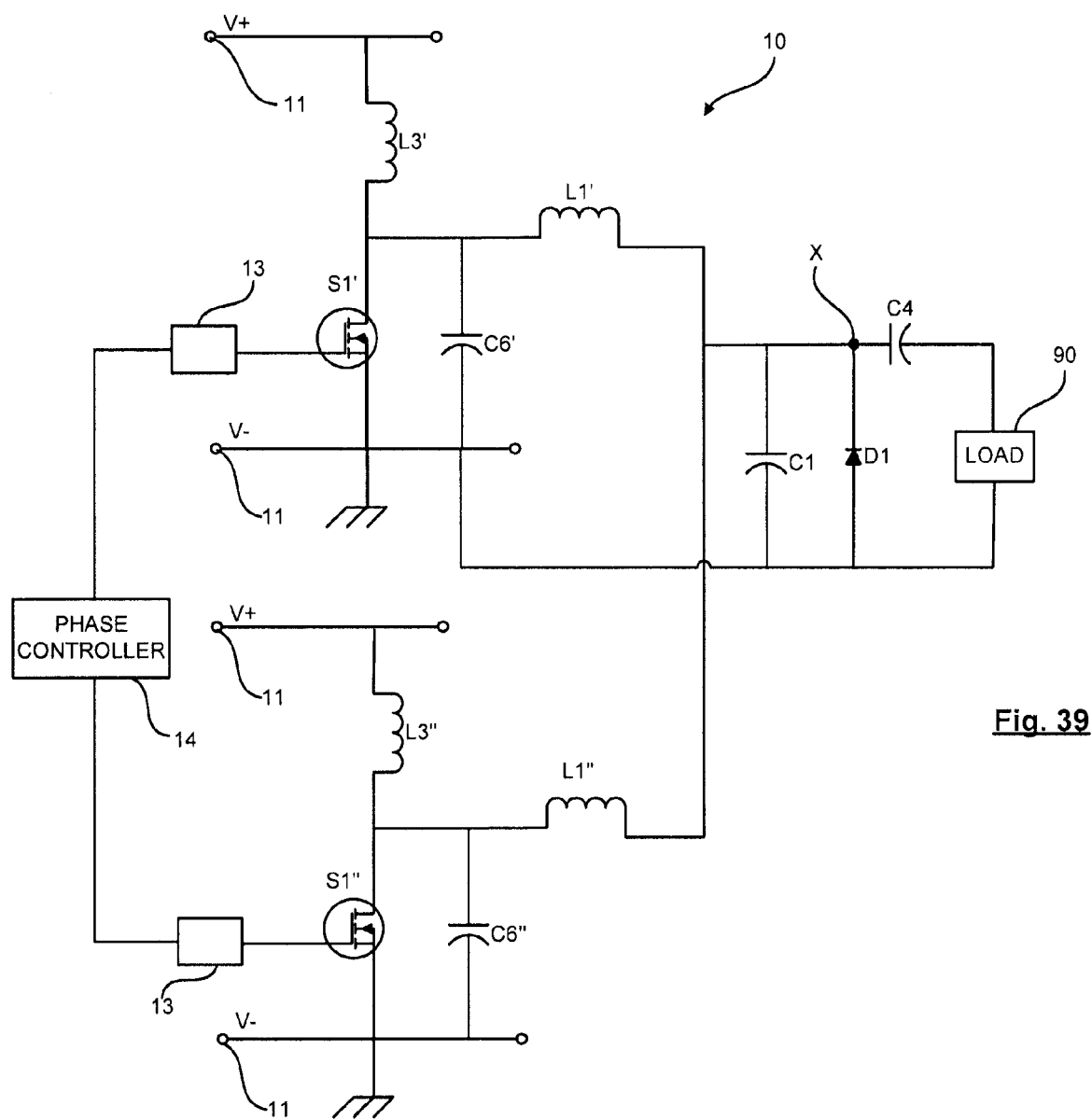
FIG. 39 is a circuit depicting a pair of single-ended amplifiers arranged in a parallel configuration.

FIG. 39 depicts a pair of class E amplifiers of the present invention arranged in a parallel configuration. The configuration of FIG. 39 is particularly directed to providing maximum power. With respect to FIGS. 37 and 38, in order to achieve maximum output power, switches S1A and S1B operate 180 degrees out-of-phase. For minimum output power in FIGS. 37 and 38, switches S1A and S1B operate in phase. With the design of FIG. 39, however, maximum output power is achieved when switches S1' and S1" operate in phase, and minimum power is achieved when S1' and S1" operate 180 degrees out-of-phase.

Figure 40:
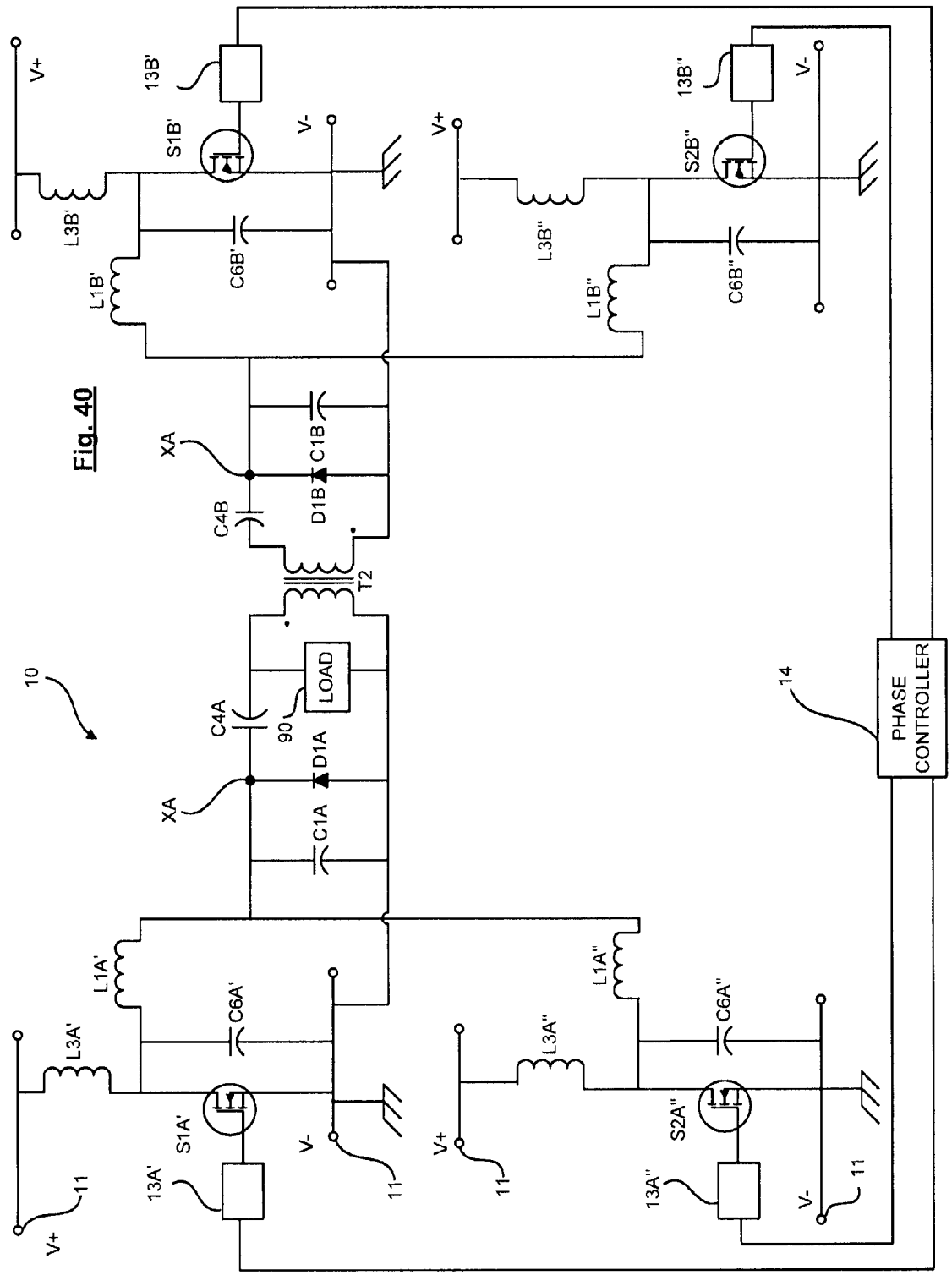
FIG. 40 is a circuit depicting single-ended amplifiers arranged in a parallel, push-pull configuration.

FIG. 40 depicts a parallel, push-pull implementation of the single-ended amplifier of the present invention. In particular, a first pair of amplifiers designate a first half of the push-pull configuration. The amplifiers comprise transistors S1A' and S2A" in series with inductors L3A' and L3A" between a pair of voltage rails. Each switch S1A' and S2A" is in parallel with respective capacitor C6A' and C6A". An inductor L1A', L1A" is placed at the output of each respective switch S1A' and S2A" and is applied to filter capacitor C1A in the first terminal. The other terminal C1A connects to ground. A clamping diode D1A is placed in parallel with capacitor C1A, and a blocking capacitor C4A is placed in series with load 90, the combination of which is in parallel with diode D1A. The second half of the push-pull configuration is similarly configured. Each half of the push-pull configuration is joined by a transistor T2, which operates as described above with respect to FIGS. 37 and 38.

Phase controller 14 generates output signals to each of a respective signal generator 13A', 13A", 13B', and 13B". Preferably, phase controller 14 operates each half of the push-pull configuration A, B 180 degrees out of phase. Within each half, phase controller 14 can vary the control signals sent to signal generators 13A', 13A" and 13B', and 13B". When signal generators 13A' and 13A" operate in phase, circuit half A of the push-pull configuration outputs maximum power, and when signal generators 13A' and 13A" operate out of phase, circuit half A outputs no power. Control signal generators 13B' and 13B" operate similarly. The circuit of FIG. 40 operates to eliminate even harmonics from the output of the single inverted configuration.

Figure 41:
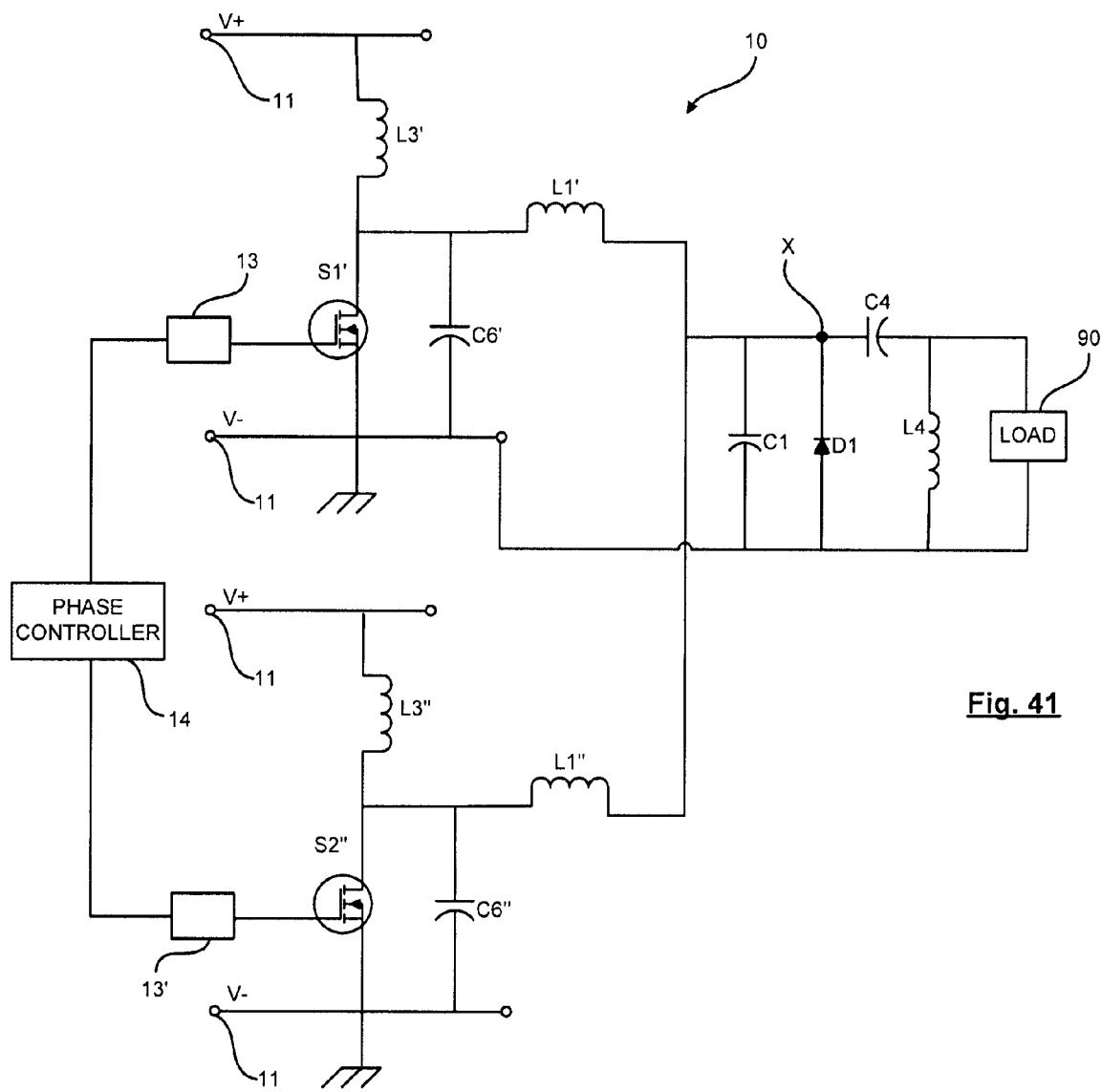
FIG. 41 is a circuit depicting a pair of single-ended amplifiers arranged in parallel and having an additional filter at the output.

FIG. 41 depicts the circuit of FIG. 39, but modified to include an additional, inductor L4 in parallel with load 90. This configuration is useful when the desired load impedance is higher than the power amplifier output impedance. This configuration further helps to eliminate even harmonics. The configuration of FIG. 41 operates slowly as described with respect to FIG. 39 with the addition of inductive filter L4.

When load 90 contains a reactive component, it presents a particular consideration. When using the phase-shifting control, one of the switches S1' or S1" may experience a negative real impedance. The negative real impedance occurs as the circuit attempts to reflect energy delivered to it by the DC rail back to the DC rail through the switches S1' or S2". Such a condition could possibly damage the switches due to reverse recovery conditions within the intrinsic body diode. This problem may be corrected by using a MOSFET with a faster body diode, or a fast diode, such as a Schottky rectifier, with a low forward voltage drop place across the MOSFET.

With respect to particular component values, the class E amplifier shown in FIG. 33, it is generally desirable that diode D1 is barely activated, but does not conduct when the load 90 is properly matched. Capacitor C4 is a DC-blocking capacitor and should include a reactive impedance much less than the impedance of the load 90. Switch S1 possess a breakdown voltage which is at least five times the value of the positive DC rail voltage V+. Capacitor C6 possesses breakdown voltage at least three five times the value of the DC rail voltage V+. Inductors L1 and L2 have equal inductances, and capacitors C6 and C1 have equal capacitance values as well. The power P delivered to the load 90 is defined below in equation (1):

$$P = \frac{V^2}{2R} \tag{1}$$

where
V—voltage applied to rails 11; and
R—impedance of load 90.

The capacitance C of C6 and C1 is defined below in equation (2)

$$C = \frac{1}{\pi \times F_{op} \times R} \tag{2}$$

where
$F_{op}$—operating frequency of the amplifier; and
R—impedance of load 90.

The inductance L of inductors L1 and L3 is defined below in equation (3)

$$L = \frac{R}{4 \times F} \tag{3}$$

where
$F_{op}$—operating frequency of the class E amplifier; and
R—impedance of load 90.

The inductance values of inductor L1 and L3 need not be equal, and the capacitance values of C6 and C6 need not be equal. Further, inductor L3 and capacitor C6 may be adjusted to vary the Vds voltage waveform shown in FIG. 36. For instance, the peak voltage may be reduced, and the symmetry of the waveform of fake FIG. 36 may be improved by adjusting the values of inductor L1 and capacitor C1. However, such adjustments may adversely impact ZVS switching.

It will be understood by one skilled in the art that the circuit variations and substitutions discussed with respect to FIGS. 1-31 may be implemented in FIGS. 32-41 where appropriate as well.

While the invention has been described in its presently preferred form, it is to be understood that there are numerous applications and implementations for the present invention. Accordingly, the invention is capable of modification and changes without departing from the spirit of the invention as set forth in the appended claims.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A power supply circuit for supplying alternating power to a load, comprising:
    a source of direct current (DC) voltage;
    a class E amplifier, the class E amplifier receiving the DC input voltage and generating an alternating current (AC) output signal;
    a first filter at the output of the amplifier, the first filter filtering out predetermined components of the AC signal to generate a filtered AC signal; and
    an output circuit at the output of the first filter for receiving the filtered AC signal and feeding the filtered AC signal to a load, wherein the output circuit includes a rectifier connected relative to a point in the output circuit such that if the voltage at the point exceeds a predetermined threshold, the rectifier conducts to cause voltage or current to return to the source of DC voltage and to clamp the point to a predetermined voltage.

2. The apparatus of claim 1 wherein the output circuit includes a rectifier connected in parallel with the load.

3. The apparatus of claim 1 wherein the first filter includes an inductor and a capacitor in series, and the first filter is placed in parallel with a switch of the amplifier.

4. The apparatus of claim 1 wherein the first filter includes an inductor and a capacitor, and the inductor is placed between an output of a switch of the amplifier and a terminal of the rectifier.

5. The apparatus of claim 1 wherein the rectifier further comprises a diode, and the first filter includes an inductor and a capacitor, and the inductor is placed between an output of the amplifier and a cathode of the diode.

6. The apparatus of claim 1 further comprising a plurality of amplifiers arranged in parallel.

7. The apparatus of claim 1 further comprising a second filter arranged in parallel with the load, the second filter further filtering out predetermined components from the filtered AC signal.

8. A power supply circuit for supplying alternating power to a load, comprising:
   a source of direct current (DC) voltage;
   a pair of class E amplifiers for receiving the DC input voltage and for generating an alternating current (AC) output signal, the class E amplifiers being arranged in a push-pull configuration;
   a first filter at the output of each amplifier, the first filter filtering out predetermined components of the AC signal to generate a filtered AC signal; and
   an output circuit at the output of each first filter for receiving the filtered AC signal and feeding the filtered AC signal to a load, wherein the output circuit includes a rectifier connected relative to a point in the output circuit such that if the voltage at the point exceeds a predetermined threshold, the rectifier conducts to clamp the point to a predetermined voltage.

9. The apparatus of claim 8 wherein each amplifier comprises:
   a switch connected to a first rail of the DC voltage source; and
   a resonant circuit connected between the first and a second voltage rail of the DC voltage source, wherein operating the switch energizes the resonant circuit.

10. The apparatus of claim 9 wherein the resonant circuit further comprises:
    an inductor connected between the switch and the second rail of the DC voltage source; and
    a capacitor in parallel with the switch.

11. The apparatus of claim 9 further comprising a second filter at the output of the first filter, the second filter removing predetermined components from the filtered AC signal to generate an output signal.

12. The apparatus of claim 11 wherein the second filter comprises an inductor arranged in parallel with the load.

13. The apparatus of claim 11 further comprising a blocking capacitor at the output of the second filter for removing DC components from the output of the second filter.

14. The apparatus of claim 8 wherein the first filter includes an inductor and a capacitor in series, and the first filter is arranged in parallel with the switches of the amplifiers.

15. The apparatus of claim 9 wherein the first filter includes an inductor and a capacitor, and the inductor is arranged between an output of the switch and a terminal of the rectifier.

16. The apparatus of claim 15 wherein the second filter includes an inductor, and the inductor is arranged in parallel with the load.

17. The apparatus of claim 9 wherein the amplifiers further comprises a plurality of amplifiers arranged in parallel with the load.

18. The apparatus of claim 9 wherein each amplifier forms a circuit half and a transformer interconnects each circuit half.

19. A plasma control system comprising:
    a plasma chamber excited by a radio frequency (RF) signal;
    a plasma controller for measuring operating conditions of the plasma chamber and generating control signals for varying conditions within the plasma chamber; and
    a RF generator for generating an RF signal to the plasma chamber, the RF generator including:
       a RF controller, the RF controller receiving the control signal from the plasma controller and generating a power supply control signal, and
       a power supply for receiving the power supply control signal and generating a RF signal in accordance with the power supply control signal, the power supply including:
          a source of direct current (DC) voltage;
          a class E amplifier, the class E amplifier receiving the DC input voltage and generating an alternating current (AC) output signal; and
          a first filter at the output of the amplifier, the first filter filtering out predetermined components of the AC signal to generate a filtered AC signal;
       wherein the power supply includes a protection circuit including a rectifier connected relative to a predetermined point such that such that if the voltage at the point exceeds a predetermined threshold, the rectifier clamps the voltage at the point to a predetermined voltage.

20. The apparatus of claim 19 wherein the output circuit returns voltage or current to return to the amplifier.

* * * * *

UNITED STATES PATENT AND TRADEMARK OFFICE
CERTIFICATE OF CORRECTION

PATENT NO. : 7,397,676 B2
APPLICATION NO. : 11/619246
DATED : July 8, 2008
INVENTOR(S) : Daniel J. Lincoln et al.

It is certified that error appears in the above-identified patent and that said Letters Patent is hereby corrected as shown below:

Column 5, Line 40; After "which", delete "is".

Column 6, Line 22; "FIG. 34-36" should be --FIGS. 34-36--.

Column 8, Line 49; "D2" should be --D2A--.

Column 8, Line 54; "D2" should be --D2A--.

Column 8, Line 55; "D2" should be --D2A--.

Column 8, Line 62; "D2" should be --D2A--.

Column 10, Line 43; "from" should be --form--.

Column 12, Line 48; "(Q)" should be --($\Omega$)--.

Column 16, Line 16; "D11, D12" should be --DI1, DI2--.

Column 16, Line 17; "D11, D12" should be --DI1, DI2--.

Column 16, Line 24; "D11, D12" should be --DI1, DI2--.

Column 16, Line 31; "D11, D12" should be --DI1, DI2--.

Column 17, Line 2; "Zeners" should be --Zener--.

Column 17, Line 43; "I=I$^2$" should be --I=I$_2$--.

Column 18, Line 21; "th" should be --the--.

Column 19, Line 36; "powers" should be --power--.

Column 21, Line 67; After "out", insert --of--.

Column 23, Line 49; "possess" should be --possesses--.

UNITED STATES PATENT AND TRADEMARK OFFICE
CERTIFICATE OF CORRECTION

PATENT NO.        : 7,397,676 B2
APPLICATION NO.   : 11/619246
DATED             : July 8, 2008
INVENTOR(S)       : Daniel J. Lincoln et al.

It is certified that error appears in the above-identified patent and that said Letters Patent is hereby corrected as shown below:

Column 26, Line 43, Claim 19; Delete second occurrence of "such that".

Signed and Sealed this

Tenth Day of November, 2009

David J. Kappos
*Director of the United States Patent and Trademark Office*